(12) United States Patent
Kim et al.

(10) Patent No.: US 9,473,166 B2
(45) Date of Patent: Oct. 18, 2016

(54) ANALOG-TO-DIGITAL CONVERTER AND AN IMAGE SENSOR INCLUDING THE SAME

(71) Applicants: SAMSUNG ELECTRONICS CO., LTD., Suwon-si, Gyeonggi-do (KR); INDUSTRY-ACADEMIC COOPERATION FOUNDATION, YONSEI UNIVERSITY, Seoul (KR)

(72) Inventors: Jae-Hong Kim, Suwon-si (KR); Youngcheol Chae, Seoul (KR); Seungwoo Song, Busan (KR); Woojin Jo, Seoul (KR); Hyunseok Hwang, Mungyeong-si (KR)

(73) Assignees: SAMSUNG ELECTRONICS CO., LTD., Suwon-Si, Gyeonggi-Do (KR); INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 2 days.

(21) Appl. No.: 14/692,787

(22) Filed: Apr. 22, 2015

(65) Prior Publication Data
US 2015/0311912 A1 Oct. 29, 2015

(30) Foreign Application Priority Data
Apr. 23, 2014 (KR) ........................ 10-2014-0048817

(51) Int. Cl.
*H03M 1/12* (2006.01)
*H03M 3/00* (2006.01)
*H03M 1/06* (2006.01)

(52) U.S. Cl.
CPC ........... *H03M 3/462* (2013.01); *H03M 1/0626* (2013.01); *H03M 1/123* (2013.01); *H03M 3/344* (2013.01); *H03M 3/466* (2013.01)

(58) Field of Classification Search
CPC .... H03M 3/462; H03M 1/123; H03M 3/466; H03M 3/344; H03M 1/0626
USPC .......................................................... 341/155
See application file for complete search history.

(56) References Cited

U.S. PATENT DOCUMENTS

| 6,820,103 | B2 | 11/2004 | Butler et al. |
| 6,963,890 | B2 | 11/2005 | Dutta et al. |
| 7,227,570 | B2* | 6/2007 | Sato ........................ H04N 5/335 341/155 |
| 7,293,055 | B2 | 11/2007 | McAdam et al. |
| 7,348,915 | B2 | 3/2008 | Leonard et al. |
| 7,587,440 | B2* | 9/2009 | Aramaki ............ H03H 17/0223 708/313 |

(Continued)

FOREIGN PATENT DOCUMENTS

| KR | 1020010014014 | 2/2001 |
| KR | 1020030045017 | 6/2003 |

(Continued)

*Primary Examiner* — Khai M Nguyen
(74) *Attorney, Agent, or Firm* — F. Chau & Associates, LLC

(57) ABSTRACT

An analog-to-digital converter includes a modulator, a controller, and a digital filter. The modulator generates a modulated signal based on an analog signal. The controller generates a weight control signal. The digital filter includes a weight signal generator and a first integrator. The weight signal generator generates a weight signal based on the weight control signal. The first integrator generates a digital signal corresponding to the analog signal by integrating the weight signal in response to the modulated signal. The weight control signal corresponds to a type and an order of the digital filter.

19 Claims, 17 Drawing Sheets

(56) References Cited

U.S. PATENT DOCUMENTS

| | | |
|---|---|---|
| 7,846,271 B2 | 12/2010 | Choi et al. |
| 8,233,068 B2 | 7/2012 | Chae et al. |
| 8,369,420 B2 | 2/2013 | Chiang et al. |
| 8,451,158 B2 | 5/2013 | Liao et al. |
| 2005/0171988 A1 | 8/2005 | Koyanagi |
| 2007/0052557 A1 | 3/2007 | Magdeburger et al. |
| 2011/0069211 A1 | 3/2011 | Jung et al. |
| 2012/0051425 A1 | 3/2012 | Chong et al. |

FOREIGN PATENT DOCUMENTS

| | | |
|---|---|---|
| KR | 1020040002846 | 1/2004 |
| KR | 1020050075365 | 7/2005 |
| KR | 1020080053327 | 6/2008 |
| KR | 2013-0070636 | 6/2013 |

* cited by examiner

F I G. 2
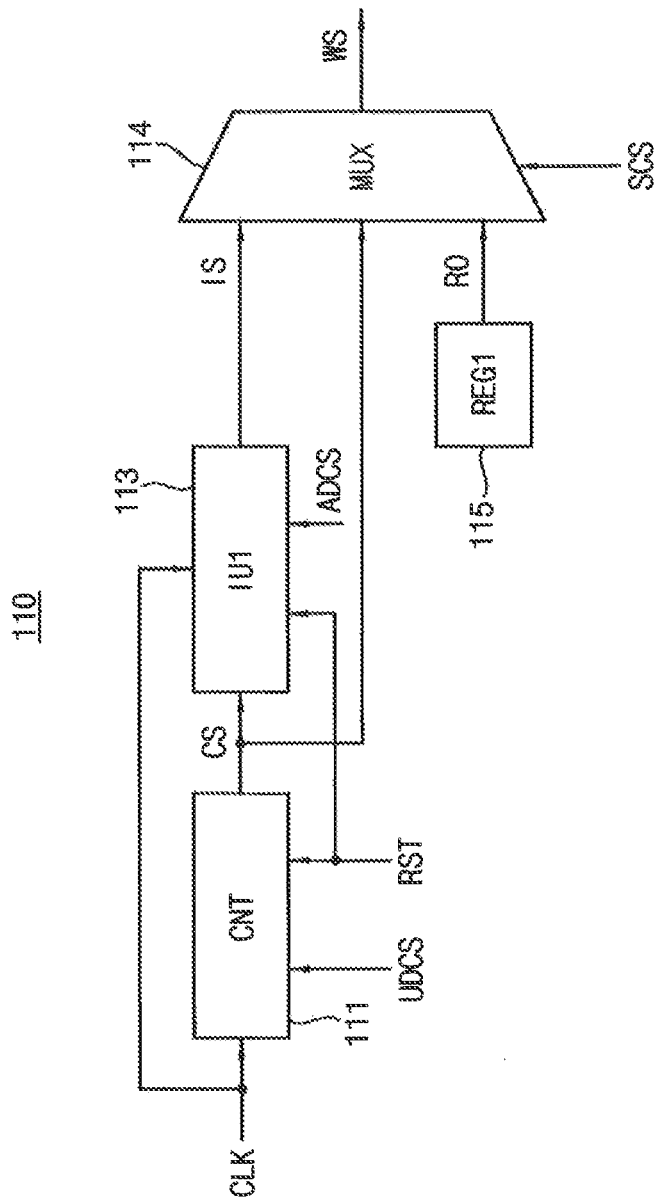

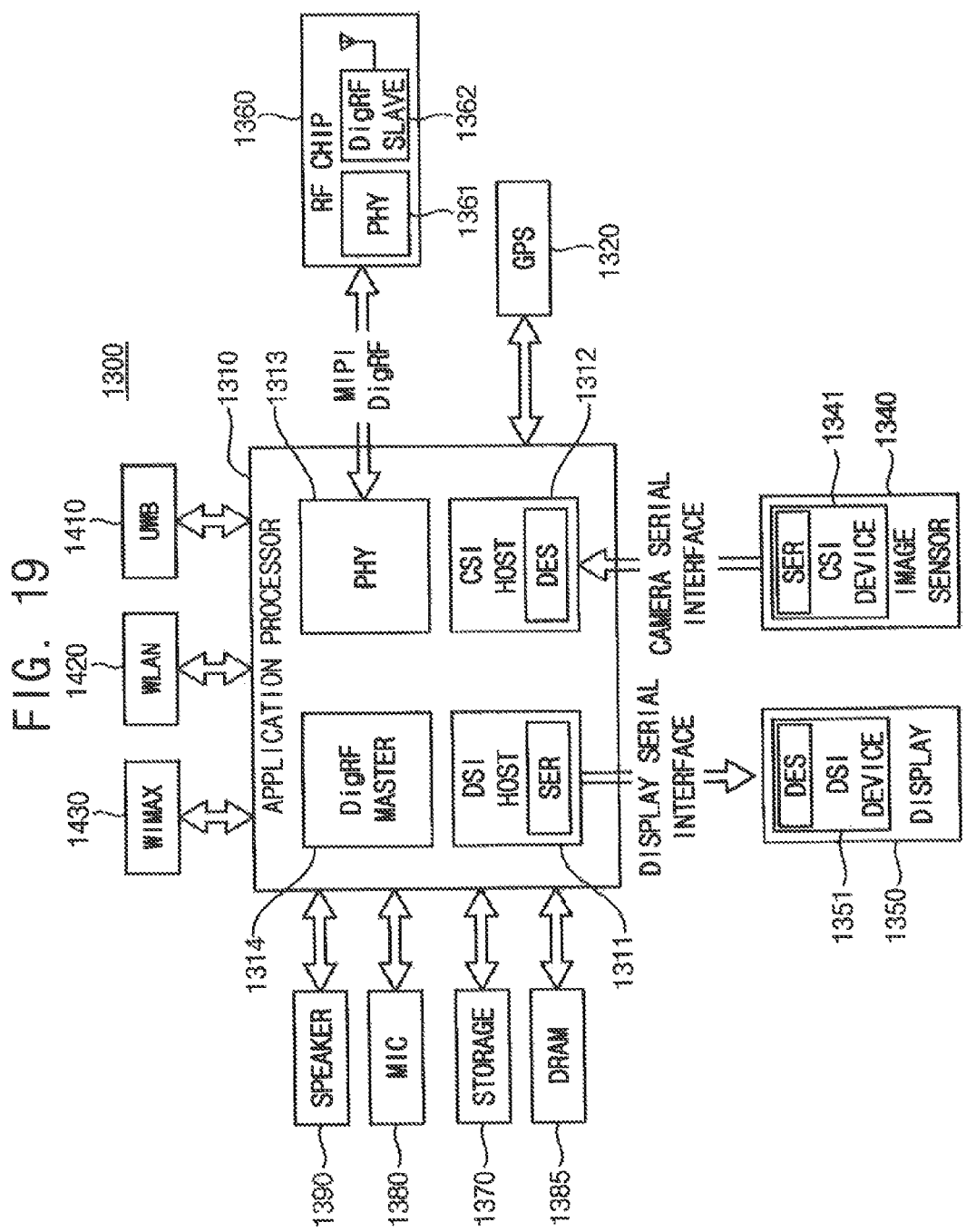

ANALOG-TO-DIGITAL CONVERTER AND AN IMAGE SENSOR INCLUDING THE SAME

CROSS-REFERENCE TO RELATED APPLICATION

This U.S. Non-provisional patent application claims priority under 35 U.S.C. §119 to Korean Patent Application No. 10-2014-0048817, filed on Apr. 23, 2014, in the Korean Intellectual Property Office (KIPO), the disclosure of which is incorporated by reference herein in its entirety.

TECHNICAL FIELD

Exemplary embodiments of the inventive concept relate to an analog-to-digital converter, and more particularly, to an analog-to-digital converter including a digital filter which may modify weights and an image sensor including the analog-to-digital converter.

DISCUSSION OF THE RELATED ART

An image sensor is a device that converts an optical image into an electronic signal. It is used mostly in digital cameras, camera modules and other imaging devices. Generally, an image sensor includes a pixel array, and an analog-to-digital converter connected to each column of the array to convert an analog signal, which is generated by a pixel of the column, into a digital signal. The analog-to-digital converter may be a single-slope analog-to-digital converter or a delta-sigma analog-to-digital converter.

SUMMARY

An exemplary embodiment of the inventive concept provides an analog-to-digital converter including a digital filter which may modify weights representing a type and an order of digital filtering.

An exemplary embodiment of the inventive concept provides an image sensor including an analog-to-digital converter having a digital filter which may modify weights representing a type and an order of digital filtering.

According to an exemplary embodiment of the inventive concept, an analog-to-digital converter includes a modulator, a controller, and a digital filter. The modulator generates a modulated signal based on an analog signal. The controller generates a weight control signal. The digital filter includes a weight signal generator and a first integrator. The weight signal generator generates a weight signal based on the weight control signal. The first integrator generates a digital signal corresponding to the analog signal by integrating the weight signal in response to the modulated signal. The weight control signal corresponds to a type and an order of the digital filter.

In an exemplary embodiment of the inventive concept, the weight control signal may include a count control signal, a calculation control signal and a selection control signal.

In an exemplary embodiment of the inventive concept, the count control signal and the calculation control signal may be periodic signals, respectively.

In an exemplary embodiment of the inventive concept, the weight signal generator may initialize the weight signal at each of at least two periods of the count control signal and the calculation control signal in response to a reset signal generated by the controller. The first integrator may initialize the digital signal at each of at least two periods of the count control signal and the calculation control signal in response to the reset signal.

In an exemplary embodiment of the inventive concept, the weight signal generator may include a counter, an integration unit, a first register and a multiplexer. The counter may generate a count signal by counting a number of edges of a clock signal in response to the count control signal. The integration unit may generate an integrated signal by integrating the count signal in response to the calculation control signal. The multiplexer may output one of the count signal, the integrated signal, and an output signal of the first register as the weight signal in response to the selection control signal.

In an exemplary embodiment of the inventive concept, the counter may execute an up-counting for the count signal when the count control signal has logical value 1. The counter may execute a down-counting for the count signal when the count control signal has logical value 0. The counter may initialize the count signal in response to a reset signal generated by the controller.

In an exemplary embodiment of the inventive concept, the integration unit may include a calculation unit and a second register. The calculation unit may generate a calculated signal by adding the integrated signal and the count signal or generate the calculated signal by subtracting the count signal from the integrated signal in response to the calculation control signal. The second register may store the calculated signal as the integrated signal in synchronization with the clock signal. The second register may initialize the integrated signal in response to a reset signal generated by the controller.

In an exemplary embodiment of the inventive concept, the calculation unit may generate the calculated signal by adding the integrated signal and the count signal when the calculation control signal has logical value 1. The calculation unit may generate the calculated signal by subtracting the count signal from the integrated signal when the calculation control signal has logical value 0.

In an exemplary embodiment of the inventive concept, the first integrator may include a multiplexer and an integration unit. The multiplexer may output one of the weight signal and logical value 0 as a multiplexer output signal in response to the modulated signal. The integration unit may generate the digital signal by integrating the multiplexer output signal in response to a clock signal.

In an exemplary embodiment of the inventive concept, the integration unit may include an adder and a register. The adder may generate an added signal by adding the multiplexer output signal and the digital signal. The register may store the added signal as the digital signal in synchronization with the clock signal. The register may initialize the digital signal in response to a reset signal generated by the controller.

In an exemplary embodiment of the inventive concept, the first integrator may include a AND gate and an integration unit. The AND gate may generate a register control signal by performing a logical AND operation on the modulated signal and a clock signal. The integration unit may generate the digital signal by integrating the weight signal in response to the register control signal.

In an exemplary embodiment of the inventive concept, the integration unit may include an adder and a register. The adder may generate an added signal by adding the weight signal and the digital signal. The register may store the added signal as the digital signal in synchronization with the register control signal. The register may initialize the digital signal in response to a reset signal generated by the controller.

In an exemplary embodiment of the inventive concept, the type of the digital filter may be a MATCHED type or a SINC type.

In an exemplary embodiment of the inventive concept, the type of the digital filter may be a CUSTOM type having a user-defined frequency response.

In an exemplary embodiment of the inventive concept, the order of the digital filter may be one, two or three.

According to an exemplary embodiment of the inventive concept, an image sensor includes a pixel array, a plurality of analog-to-digital converters, and a switch circuit. The pixel array includes a plurality of pixels output pixel signals corresponding to incident light. The plurality of analog-to-digital converters generate digital signals corresponding to the pixel signals. The switch circuit selects one of the digital signals based on a column selection signal. The switch circuit outputs the selected digital signal. At least one of the plurality of the analog-to-digital converters includes a modulator, a controller, and a digital filter. The modulator generates a modulated signal based on the pixel signals. The controller generates a weight control signal. The digital filter includes a weight signal generator and an integrator. The weight signal generator generates a weight signal based on the weight control signal. The integrator generates the digital signals corresponding to the pixel signals by integrating the weight signal in response to the modulated signal. The weight control signal corresponds to a type and an order of the digital filter.

According to an exemplary embodiment of the inventive concept, an image sensor includes a pixel array, a controller, a weight signal generator, first through (N)-th modulators (N is a natural number), first through (N)-th integrators, and a switch circuit. The pixel array includes a plurality of pixels outputting first through (N)-th pixel signals corresponding to intensity of incident light. The controller generates a weight control signal. The weight control signal corresponds to a type and an order of digital filtering. The weight signal generator generates a weight signal based on the weight control signal. The switch circuit selects one of first through (N)-th digital signals based on a column selection signal. The switch circuit outputs the selected digital signal. The (K)-th modulator generates the (K)-th modulated signal based on the (K)-th pixel signal (K is a natural number less than or equal to M. The (K)-th integrator generates the (K)-th digital signal corresponding to the (K)-th pixel signal by integrating the weight signal in response to the (K)-th modulated signal.

In an exemplary embodiment of the inventive concept, the weight control signal may include a count control signal, a calculation control signal and a selection control signal.

In an exemplary embodiment of the inventive concept, the count control signal and the calculation control signal may be periodic signals, respectively.

BRIEF DESCRIPTION OF THE DRAWINGS

The above and other feature of the inventive concept will become more clearly understood by describing in detail exemplary embodiments thereof with reference to the accompanying drawings.

FIG. 2 is a block diagram illustrating a weight signal generator included in the analog-to-digital converter of FIG. 1, according to an exemplary embodiment of the inventive concept.

FIG. 19 is a computing system according to an exemplary embodiment of the inventive concept.

DETAILED DESCRIPTION OF THE EMBODIMENTS

Figure 1:
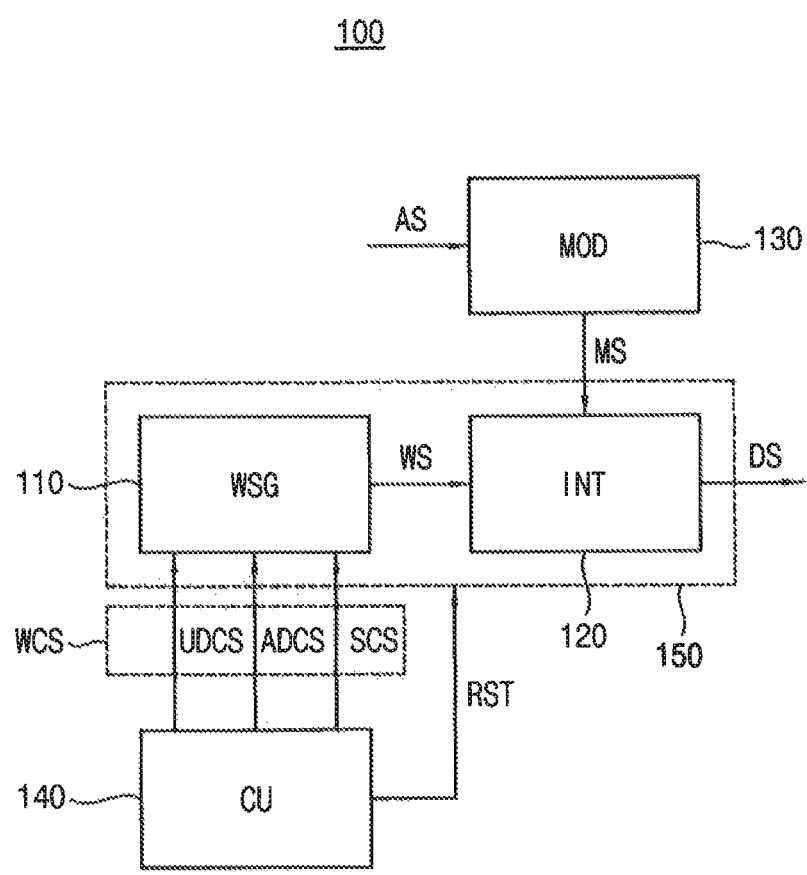
FIG. 1 is a block diagram illustrating an analog-to-digital converter according to an exemplary embodiment of the inventive concept.

Exemplary embodiments of the inventive concept will be described more fully hereinafter with reference to the accompanying drawings. The present inventive concept may, however, be embodied in many different forms and should not be construed as limited to the exemplary embodiments set forth herein. In the drawings, the sizes and relative sizes of layers and regions may be exaggerated for clarity. Like numerals may refer to like elements throughout this application.

It will be understood that when an element is referred to as being "connected" or "coupled" to another element, it can be directly connected or coupled to the other element or intervening elements may be present.

As used herein, the singular forms "a," "an" and "the" are intended to include the plural forms as well, unless the context clearly indicates otherwise.

FIG. 1 is a block diagram illustrating an analog-to-digital converter according to an exemplary embodiment of the inventive concept.

Referring to FIG. 1, an analog-to-digital converter 100 includes a modulator MOD 130, a controller CU 140, and a digital filter 150. The modulator 130 generates a modulated signal MS based on an analog signal AS. The controller 140 generates a weight control signal WCS representing a type and an order of digital filtering. The weight control signal WCS is configurable. The digital filter 150 includes a weight signal generator WSG 110 and a first integrator INT 120. The weight signal generator 110 generates a weight signal WS based on the weight control signal WCS. The first integrator 120 generates a digital signal DS corresponding to the analog signal AS by integrating the weight signal WS in response to the modulated signal MS.

The weight control signal WCS may include a count control signal UDCS, a calculation control signal ADCS and a selection control signal SCS.

The type of the digital filter 150 may be a MATCHED, a SINC, or a CUSTOM type. The CUSTOM type digital filter 150 may have a frequency response pre-defined by a user. The order of the digital filter 150 may be one, two or three. The count control signal UDCS and the calculation control signal ADCS may be periodic signals, respectively. The MATCHED filter (also known as a North filter) is obtained by correlating a known signal, or template, with an unknown signal to detect the presence of the template in the unknown signal, for example. The SINC filter is an idealized filter that removes all frequency components above a given cutoff frequency, without affecting lower frequencies, and has linear phase response, for example.

The modulator 130 may generate the modulated signal MS, which is a sequential 1-bit signal, by sampling the analog signal AS with a sampling frequency fs. The modulator 130 may be included in a sigma-delta analog-to-digital converter.

The weight signal generator 110 may initialize the weight signal WS at each period of the count control signal UDCS and the calculation control signal ADCS in response to a reset signal RST generated by the controller 140. The first integrator 120 may initialize the digital signal DS at each period of the count control signal. UDCS and the calculation control signal ADCS in response to the reset signal RST.

A structure of the weight signal generator 110 will be described with reference to FIGS. 2 and 3. A structure of the first integrator 120 will be described with reference to FIGS. 4 through 7. An operation of the analog-to-digital converter 100 according to exemplary embodiments of the inventive will be described with reference to FIGS. 8 through 15.

FIG. 2 is a block diagram illustrating the weight signal generator 110 included in the analog-to-digital converter 100 of FIG. 1, according to an exemplary embodiment of the inventive concept.

Referring to FIG. 2, the weight signal generator 110 may include a counter CNT 111, an integration unit IU1 113, a first register REG1 115, and a multiplexer MUX 114. The counter ill may generate a count signal CS by counting a number of edges of a clock signal CLK in response to the count control signal UDCS. The integration unit 113 may generate an integrated signal IS by integrating the count signal CS in response to the calculation control signal ADCS. The multiplexer 114 may output one of the count signal CS, the integrated signal IS, and an output signal RO of the first register 115 as the weight signal WS in response to the selection control signal SCS.

The counter 111 may execute an up-counting when the count control signal UDCS has logical value 1. The counter 111 may execute a down-counting when the count control signal UDCS has logical value 0. The counter 111 may initialize the count signal CS in response to a reset signal RST generated by the controller 140.

The integration unit 113 may initialize the integrated signal IS in response to the reset signal RST. The integration unit 113 will be described in more detail with reference to FIG. 3.

When the count control signal UDCS corresponding to a SINC digital filter is inputted to the counter 111, the counter 111 outputs a weight signal corresponding to a second-order SINC digital filter as the count signal CS, the integration unit 113 outputs a weight signal corresponding to a third-order SINC digital filter as the integrated signal IS, and the output signal RO of the first register 115 is a weight signal corresponding to a first-order SINC digital filter.

When the selection control signal SCS has value 0, the multiplexer 114 outputs the output signal RO of the first register 115 corresponding to the first-order SINC digital filter as the weight signal WS. When the selection control signal SCS has value 1, the multiplexer 114 outputs the count signal CS corresponding to the second-order SINC digital filter as the weight signal WS. When the selection control signal SCS has value 2, the multiplexer 114 outputs the integrated signal IS corresponding to the third-order SINC digital filter as the weight signal WS.

The analog-to-digital converter 100 including the digital filter 150 operating as the second-order SINC digital filter will be described in more detail with reference to FIGS. 8 through 13. The analog-to-digital converter 100 including the digital filter 150 operating as the third-order SINC digital filter will be described in more detail with reference to FIG. 11.

When the count control signal UDCS corresponding to a MATCHED digital filter is inputted to the counter 111, the counter 111 outputs a weight signal corresponding to a first-order MATCHED digital filter as the count signal CS, and the integration unit 113 outputs a weight signal corresponding to a second-order MATCHED digital filter as the integrated signal IS.

When the selection control signal SCS has value 1, the multiplexer 114 outputs the count signal CS corresponding to the first-order MATCHED digital filter as the weight signal WS. When the selection control signal SCS has value 2, the multiplexer 114 outputs the integrated signal IS corresponding to the second-order MATCHED digital filter as the weight signal WS.

The analog-to-digital converter 100 including the digital filter 150 operating as the first-order MATCHED digital filter will be described with reference to FIGS. 10 and 15. The analog-to-digital converter 100 including the digital filter 150 operating as the second-order MATCHED digital filter will be described with reference to FIG. 12.

The digital filter 150 may be a CUSTOM digital filter. The CUSTOM digital filter is a digital filter having a frequency response pre-defined by a user. When the count control signal UDCS corresponding to the CUSTOM digital filter is inputted to the counter 111, the counter 111 outputs a weight signal corresponding to the CUSTOM digital filter as the count signal CS. When the selection control signal SCS has value 1, the multiplexer 114 outputs the count signal CS corresponding to the CUSTOM digital filter as the weight signal WS.

The analog-to-digital converter 100 including the digital filter 150 operating as the CUSTOM digital filter will be described in more detail with reference to FIGS. 9 and 14.

Figure 3:
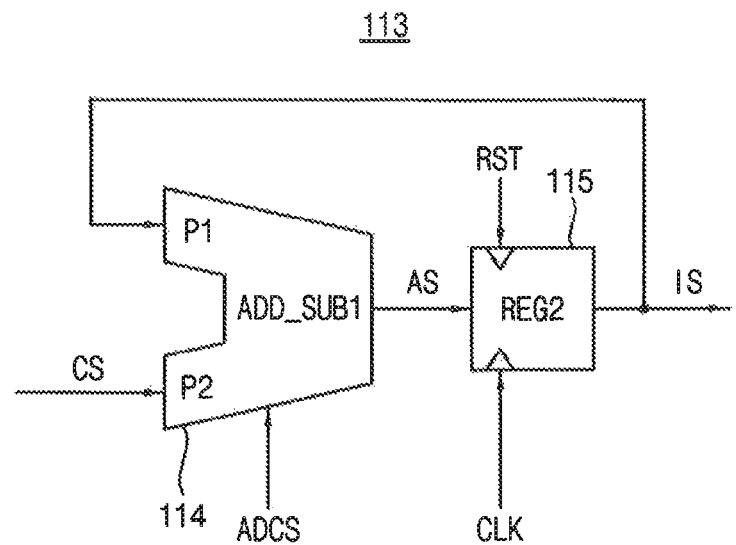
FIG. 3 is a block diagram illustrating an integration unit included in the weight signal generator of FIG. 2, according to an exemplary embodiment of the inventive concept.

FIG. 3 is a block diagram illustrating the integration unit 113 included in the weight signal generator 110 of FIG. 2, according to an exemplary embodiment of the inventive concept.

Referring to FIG. 3, the integration unit 113 may include a calculation unit ADD_SUB1 114 and a second register REG2 115. The calculation unit 114 may include a first port P1 and a second port P2. The calculation unit 114 may generate a calculated signal AS by adding the integrated signal IS and the count signal CS or generate the calculated signal AS by subtracting the count signal CS from the integrated signal IS in response to the calculation control signal ADCS. The second register 115 may store the calculated signal AS as the integrated signal IS in synchronization with the clock signal CLK. The second register 115 may initialize the integrated signal IS in response to a reset signal RST generated by the controller 140.

In detail, the calculation unit 114 may generate the calculated signal AS by adding the integrated signal IS, which is received through the first port P1, and the count signal CS, which is received through the second port P2, when the calculation control signal ADCS has logical value 1. The calculation unit 114 may generate the calculated signal AS by subtracting the count signal CS, which is received through the second port P2, from the integrated signal IS, which is received through the first port P1, when the calculation control signal ADCS has logical value 0.

Figure 4:
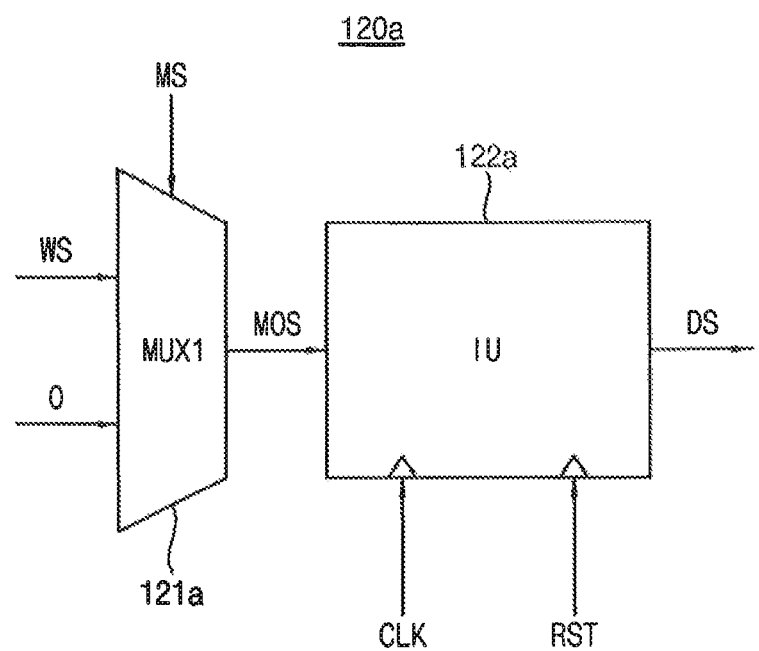
FIG. 4 is a block diagram illustrating a first integrator included in the analog-to-digital converter of FIG. 1, according to an exemplary embodiment of the inventive concept.

FIG. 4 is a block diagram illustrating the first integrator 120 (referred to as 120a in FIG. 4) included in the analog-to-digital converter 100 of FIG. 1, according to an exemplary embodiment of the inventive concept.

Referring to FIG. 4, the first integrator 120a included in the analog-to-digital converter 100 of FIG. 1 may include a multiplexer MUX1 121a and an integration unit IU 122a. The multiplexer 121a may output one of the weight signal WS and logical value 0 as a multiplexer output signal MOS in response to the modulated signal MS. The integration unit 122a may generate the digital signal DS by integrating the multiplexer output signal MOS in response to a clock signal CLK. The integration unit 122a may initialize the digital signal DS in response to the reset signal RST.

In an exemplary embodiment of the inventive concept, the multiplexer 121a may output the weight signal WS as the multiplexer output signal MOS when the modulated signal MS has logical value 0. The multiplexer 121a may output logical value 0 as the multiplexer output signal MOS when the modulated signal MS has logical value 1.

In an exemplary embodiment of the inventive concept, the multiplexer 121a may output logical value 0 as the multiplexer output signal MOS when the modulated signal MS has logical value 0. The multiplexer 121a may output the weight signal WS as the multiplexer output signal MOS when the modulated signal MS has logical value 1. The integration unit 122a may generate the digital signal DS by integrating the multiplexer output signal MOS in response to the clock signal CLK. The integration unit 122a will be described in more detail with the reference to FIG. 5.

Figure 5:
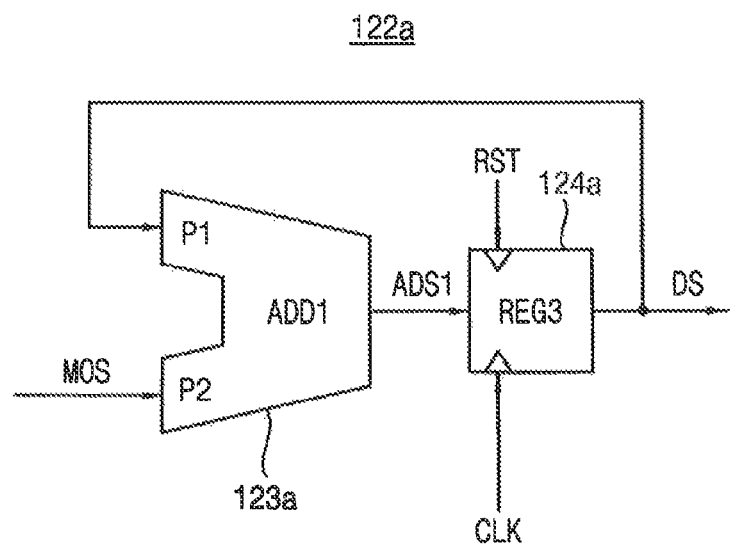
FIG. 5 is a block diagram illustrating an integration unit included in the first integrator of FIG. 4, according to an exemplary embodiment of the inventive concept.

FIG. 5 is a block diagram illustrating the integration unit 122a included in the first integrator 120a of FIG. 4.

Referring to FIG. 5, the integration unit 122a included in the first integrator 120a of FIG. 4 may include an adder ADD1 123a and a third register REG3 124a. The adder 123a may include a first port P1 and a second port P2. The adder 123a may generate an added signal ADS1 by adding the multiplexer output signal MOS, which is received through the second port P2, and the digital signal DS, which is received through the first port P1. The third register 124a may store the added signal ADS1 as the digital signal DS in synchronization with the clock signal CLK. The third register 124a may initialize the digital signal DS in response to a reset signal RST generated by the controller 140.

Figure 6:
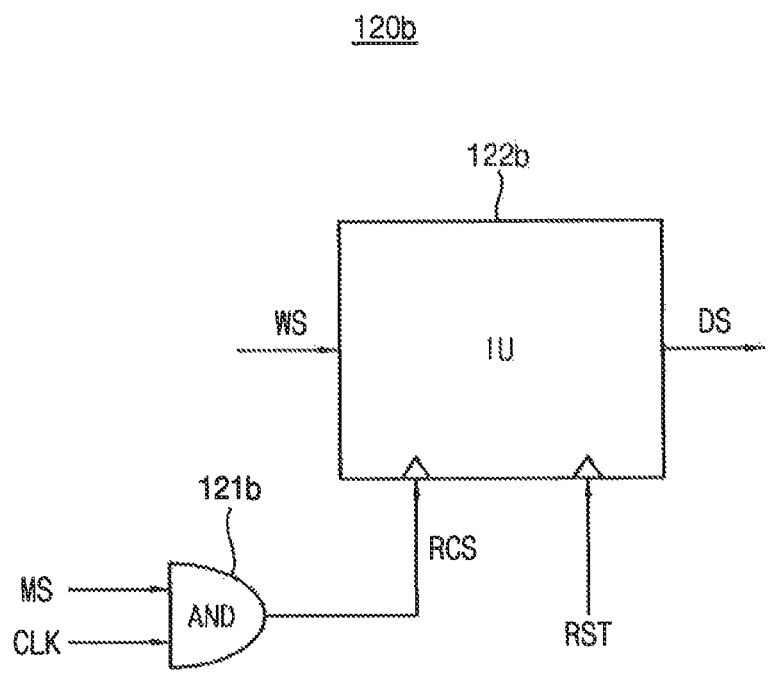
FIG. 6 is a block diagram illustrating a first integrator included in the analog-to-digital converter of FIG. 1, according to an exemplary embodiment of the inventive concept.

FIG. 6 is a block diagram illustrating the first integrator 120 (referred to as 120a in FIG. 6) included in the analog-to-digital converter 100 of FIG. 1.

Referring to FIG. 6, the first integrator 120b included in the analog-digital converter 100 of FIG. 1 may include a AND gate AND 121b and an integration unit IU 122b. The AND gate 121b may generate a register control signal RCS by performing a logical AND operation on the modulated signal MS and a clock signal CLK. The integration unit 122.b may generate the digital signal DS by integrating the weight signal WS in response to the register control signal RCS. The integration unit 122b may initialize the digital signal DS in response to the reset signal RST. The integration unit 122b will be described in more detail with the reference to FIG. 7.

Figure 7:
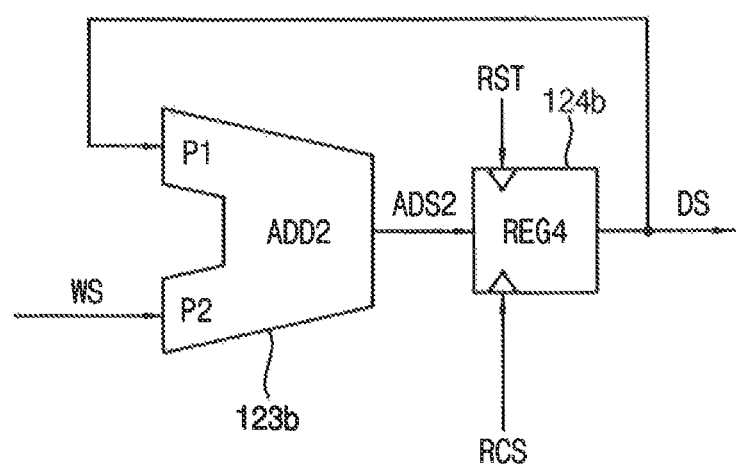
FIG. 7 is a block diagram illustrating an integration unit included in the first integrator of FIG. 6, according to an exemplary embodiment of the inventive concept.

FIG. 7 is a block diagram illustrating the integration unit 122b included in the first integrator 120b of FIG. 6, according to an exemplary embodiment of the inventive concept.

Referring to FIG. 7, the integration unit 122b included in the first integrator 120b of FIG. 6 may include an adder ADD2 123b and a fourth register REG4 124b. The adder 123b may include a first port P1 and a second port P2. The adder 123b may generate an added signal ADS2 by adding the weight signal WS, which is received through the second port P2, and the digital signal DS, which is received through the first port P1. The fourth register 124b may store the added signal ADDS2 as the digital signal DS in synchronization with the register control signal RCS. The fourth register 124b may initialize the digital signal DS in response to a reset signal RST generated by the controller 140.

FIGS. 8 through 12 are time diagrams illustrating an operation of the analog-to-digital converter 100 which includes the first integrator 120a of FIG. 4, according to an exemplary embodiment of the inventive concept.

Figure 8:
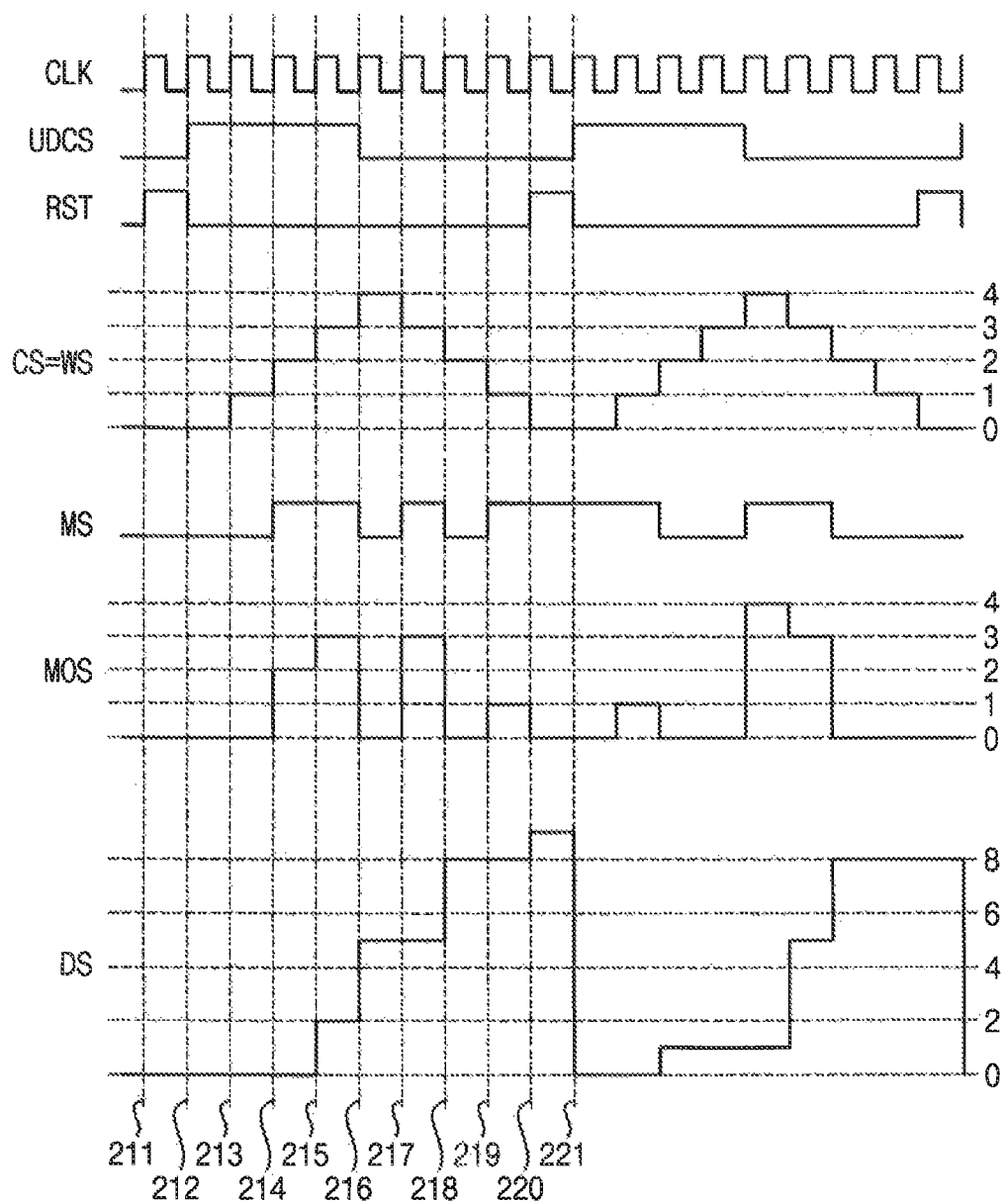
FIGS. 8, 9, 10, 11 and 12 are time diagrams illustrating an operation of the analog-to-digital converter which includes the first integrator of FIG. 4, according to an exemplary embodiment of the inventive concept.

FIG. 8 is a timing diagram illustrating an exemplary embodiment of the inventive concept in which the analog-to-digital converter 100 includes the weight signal generator 110 and the first integrator 120a, and the weight signal generator 110 generates the weight signal WS corresponding to the second-order SING digital filter.

The selection control signal SCS, which is input to the multiplexer 114 of the weight signal generator 110, has value 1. A first time point 211 through an eleventh time point 221 are in synchronization with rising edges of the clock signal CLK, respectively. A period of the weight signal WS may be from the second time point 212 to the eleventh time point 221.

At the first time point 211, the reset signal RST is activated.

At the second time point 212, the counter 111 initializes the count signal CS to 0 because the reset signal RST has logical value 1 from the first time point 211 to the second time point 212.

At the third time point 213, the counter 111 counts the count signal CS up from 0 to 1 because the count control signal UDCS has logical value 1 from the second time point 212 to the third time point 213.

At the fourth time point 214, the analog-to-digital converter 100 operates as follows. The counter 111 counts the count signal CS up from 1 to 2 because the count control signal UDCS has logical value 1 from the third time point 213 to the fourth time point 214. The multiplexer 114 outputs the count signal CS as the weight signal WS. The multiplexer 121a outputs the weight signal WS as the multiplexer output signal MOS because the level of the modulated signal MS is changed to 1.

At the fifth time point 215, the analog-to-digital converter 100 operates as follows. The counter 111 counts the count signal CS up from 2 to 3 because the count control signal UDCS has logical value 1 from the fourth time point 214 to the fifth time point 215. The multiplexer 114 outputs the count signal CS as the weight signal WS. The multiplexer 121a outputs the weight signal WS as the multiplexer output signal MOS because the level of the modulated signal MS maintains 1. The integration unit 122a outputs 2, which is calculated by adding the level of the initialized digital signal DS (0) and the level of the multiplexer output signal MOS from the fourth time point 214 to the fifth time point 215 (2), as the digital signal DS.

At the sixth time point 216, the analog-to-digital converter 100 operates as follows. The counter 111 counts the count signal CS up from 3 to 4 because the count control signal UDCS has logical value 1 from the fifth time point 215 to the sixth time point 216. The multiplexer 114 outputs the count signal CS as the weight signal WS. The multiplexer 121a outputs logical value 0 as the multiplexer output signal MOS because the level of the modulated signal MS is changed to 0. The integration unit 122a outputs 5, which is calculated by adding the level of the digital signal DS from the fifth time point 215 to the sixth time point 216 (2) and the level of the multiplexer output signal MOS from the fifth time point 215 to the sixth time point 216 (3), as the digital signal DS.

At the seventh time point 217, the analog-to-digital converter 100 operates as follows. The counter 111 counts the count signal CS down from 4 to 3 because the count control signal UDCS has logical value 0 from the sixth time point 216 to the seventh time point 217. The multiplexer 114 outputs the count signal CS as the weight signal WS. The multiplexer 121a outputs the weight signal WS as the multiplexer output signal MOS because the level of the modulated signal MS is changed to 1. The integration unit 122a outputs 5, which is calculated by adding the level of the digital signal DS from the sixth time point 216 to the seventh time point 217 (5) and the level of the multiplexer output signal MOS from the sixth time point 216 to the seventh time point 217 (0), as the digital signal DS.

At the eighth time point 218, the analog-to-digital converter 100 operates as follows. The counter 111 counts the count signal CS down from 3 to 2 because the count control signal UDCS has logical value 0 from the seventh time point 217 to the eighth time point 218. The multiplexer 114 outputs the count signal CS as the weight signal WS. The multiplexer 121a outputs logical value 0 as the multiplexer output signal MOS because the level of the modulated signal MS is changed to 0. The integration unit 122a outputs 8, which is calculated by adding the level of the digital signal DS from the seventh time point 217 to the eighth time point 218 (5) and the level of the multiplexer output signal MOS from the seventh time point 217 to the eighth time point 218 (3), as the digital signal DS.

At the ninth time point 219, the analog-to-digital converter 100 operates as follows. The counter 111 counts the count signal CS down from 2 to 1 because the count control signal UDCS has logical value 0 from the eighth time point 218 to the ninth time point 219. The multiplexer 114 outputs the count signal CS as the weight signal WS. The multiplexer 121a outputs the weight signal WS as the multiplexer output signal MOS because the level of the modulated signal MS is changed to 1. The integration unit 122a outputs 8, which is calculated by adding the level of the digital signal DS from the eighth time point 218 to the ninth time point 219 (8) and the level of the multiplexer output signal MOS from the eighth time point 218 to the ninth time point 219 (0), as the digital signal DS.

At the tenth time point 220, the analog-to-digital converter 100 operates as follows. The counter 111 counts the count signal CS down from 1 to 0 because the count control signal UDCS has logical value 0 from the ninth time point 219 to the tenth time point 220. The multiplexer 114 outputs the count signal CS as the weight signal WS. The multiplexer 121a outputs the weight signal WS as the multiplexer output signal MOS because the level of the modulated signal MS maintains 1. The integration unit 122a outputs 9, which is calculated by adding the level of the digital signal DS from the ninth time point 219 to the tenth time point 220 (8) and the level of the multiplexer output signal MOS from the ninth time point 219 to the tenth time point 220 (1), as the digital signal DS.

At the eleventh time point 221, the analog-to-digital converter 100 operates as follows. The counter 111 initializes the count signal CS to 0 because the reset signal RST has logical value 1 from the tenth time point 220 to the eleventh time point 221. A value of 9. Which is the level of the digital signal DS from the tenth time point 220 to the eleventh time point 221, corresponds to the analog signal AS input to the analog-to-digital converter 100 at a certain time.

Figure 9:
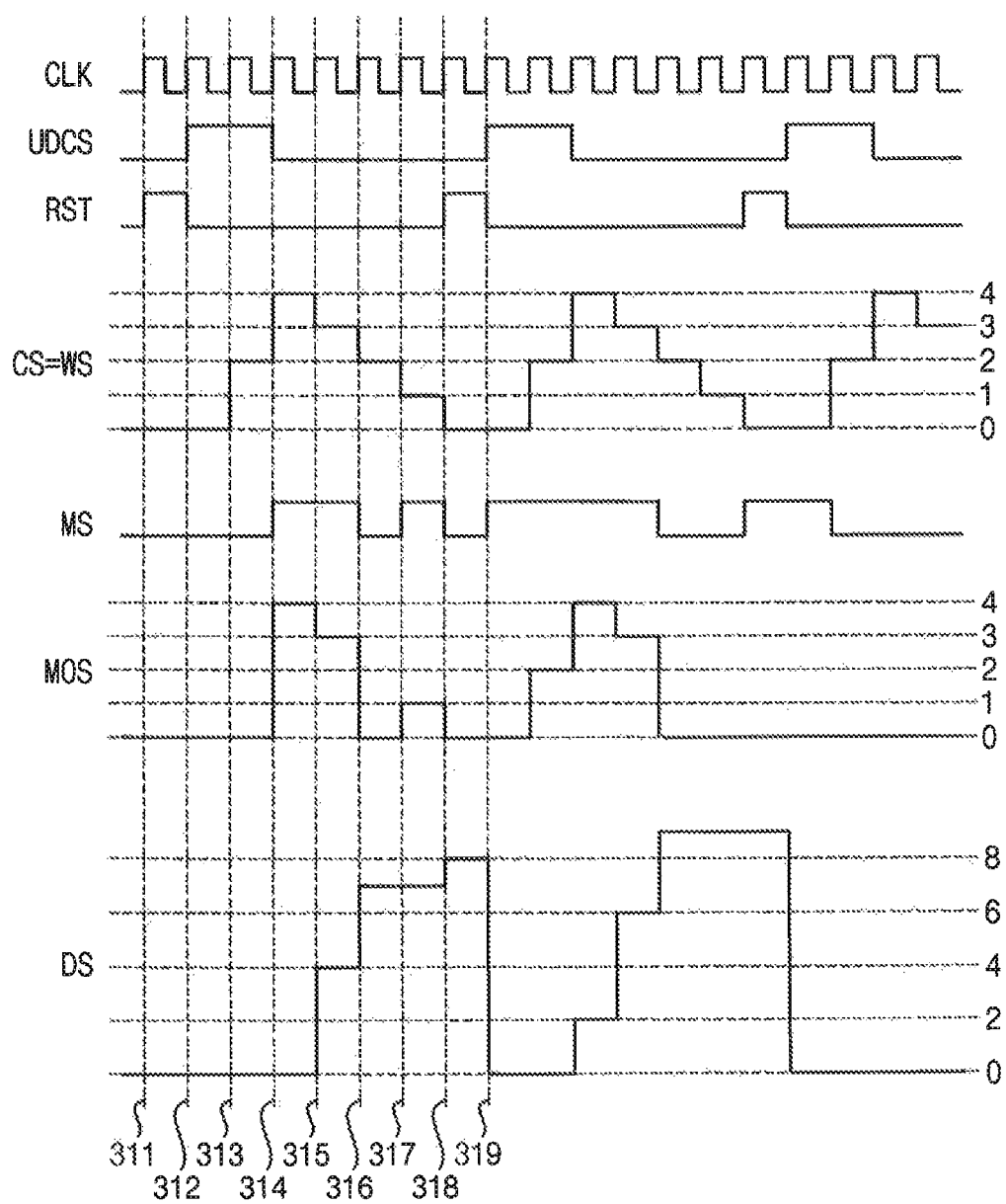

FIG. 9 is a timing diagram illustrating an exemplary embodiment of the inventive concept in which the analog-to-digital converter 100 includes the weight signal generator 110 and the first integrator 120a, and the weight signal generator 110 generates the weight signal WS corresponding to the CUSTOM digital filter.

The selection control signal SCS, which is input to the multiplexer 114 of the weight signal generator 110, has value 1. The counter 111 included in the weight signal generator 110 may count the count signal CS up by 2. The counter 111 may count the count signal CS down by 1.

A first time point 311 through a ninth time point 319 are in synchronization with rising edges of the clock signal CLK respectively. A period of the weight signal WS may be from the second time point 312 to the ninth time point 319.

At the first time point 311, the reset signal RST is activated.

At the second time point 312, the counter 111 initializes the count signal CS to 0 because the reset signal RST has logical value 1 from the first time point 311 to the second time point 312.

At the third time point 313, the counter 111 counts the count signal CS up from 0 to 2 because the count control signal UDCS has logical value 1 from the second time point 312 to the third time point 313.

At the fourth time point 314, the analog-to-digital converter 100 operates as follows. The counter 111 counts the count signal CS up from 2 to 4 because the count control signal UDCS has logical value 1 from the third time point 313 to the fourth time point 314. The multiplexer 114 outputs the count signal CS as the weight signal WS. The multiplexer 121a outputs the weight signal WS as the multiplexer output signal MOS because the level of the modulated signal MS is changed to 1. Thus, the weight signal WS is 4 and the multiplexer output signal MOS is 4 at the fourth time point 314.

At the fifth time point 315, the analog-to-digital converter 100 operates as follows. The counter 111 counts the count signal CS down from 4 to 3 because the count control signal UDCS has logical value 0 from the fourth time point 314 to the fifth time point 315. The multiplexer 114 outputs the count signal CS as the weight signal WS. The multiplexer 121a outputs the weight signal WS as the multiplexer output signal MOS because the level of the modulated signal MS maintains 1. The integration unit 122a outputs 4, which is calculated by adding the level of the initialized digital signal DS (0) and the level of the multiplexer output signal MOS from the fourth time point 314 to the fifth time point 315 (4), as the digital signal DS.

At the sixth time point 316, the analog-to-digital converter 100 operates as follows. The counter 111 counts the count signal CS down from 3 to 2 because the count control signal UDCS has logical value 0 from the fifth time point 315 to the sixth time point 316. The multiplexer 114 outputs the count signal CS as the weight signal WS. The multiplexer 121a outputs logical value 0 as the multiplexer output signal MOS because level of the modulated signal MS is changed to 0. The integration unit 122a outputs 7, which is calculated by adding the level of the digital signal DS from the fifth time point 315 to the sixth time point 316 (4) and the level of the multiplexer output signal MOS from the fifth time point 315 to the sixth time point 316 (3), as the digital signal DS.

At the seventh time point 317, the analog-to-digital converter 100 operates as follows. The counter 111 counts the count signal CS down from 2 to 1 because the count control signal UDCS has logical value 0 from the sixth time point 316 to the seventh time point 317. The multiplexer 114 outputs the count signal CS as the weight signal WS. The multiplexer 121a outputs the weight signal WS as the multiplexer output signal MOS because the level of the modulated signal MS is changed to 1. The integration unit 122.a outputs 7, which is calculated by adding the level of the digital signal DS from the sixth time point 316 to the seventh time point 317 (7) and the level of the multiplexer output signal MOS from the sixth time point 316 to the seventh time point 317 (0), as the digital signal DS.

At the eighth time point 318, the analog-to-digital converter 100 operates as follows. The counter 111 counts the count signal CS down from 1 to 0 because the count control signal UDCS has logical value 0 from the seventh time point 317 to the eighth time point 318. The multiplexer 114 outputs the count signal CS as the weight signal WS. The multiplexer 121a outputs logical value 0 as the multiplexer output signal MOS because the level of the modulated signal MS is changed to 0. The integration unit 122a outputs 8, which is calculated by adding the level of the digital signal DS from the seventh time point 317 to the eighth time point 318 (7) and the level of the multiplexer output signal MOS from the seventh time point 317 to the eighth time point 318 (1), as the digital signal DS.

At the ninth time point 319, the analog-to-digital converter 100 operates as follows. The counter 111 initializes the count signal CS to 0 because the reset signal RST has logical value 1 from the eighth time point 318 to the ninth time point 319. A value of 8, which is the level of the digital signal DS from the eighth time point 318 to the ninth time point 319, corresponds to the analog signal AS input to the analog-to-digital converter 100 at a certain time.

Figure 10:
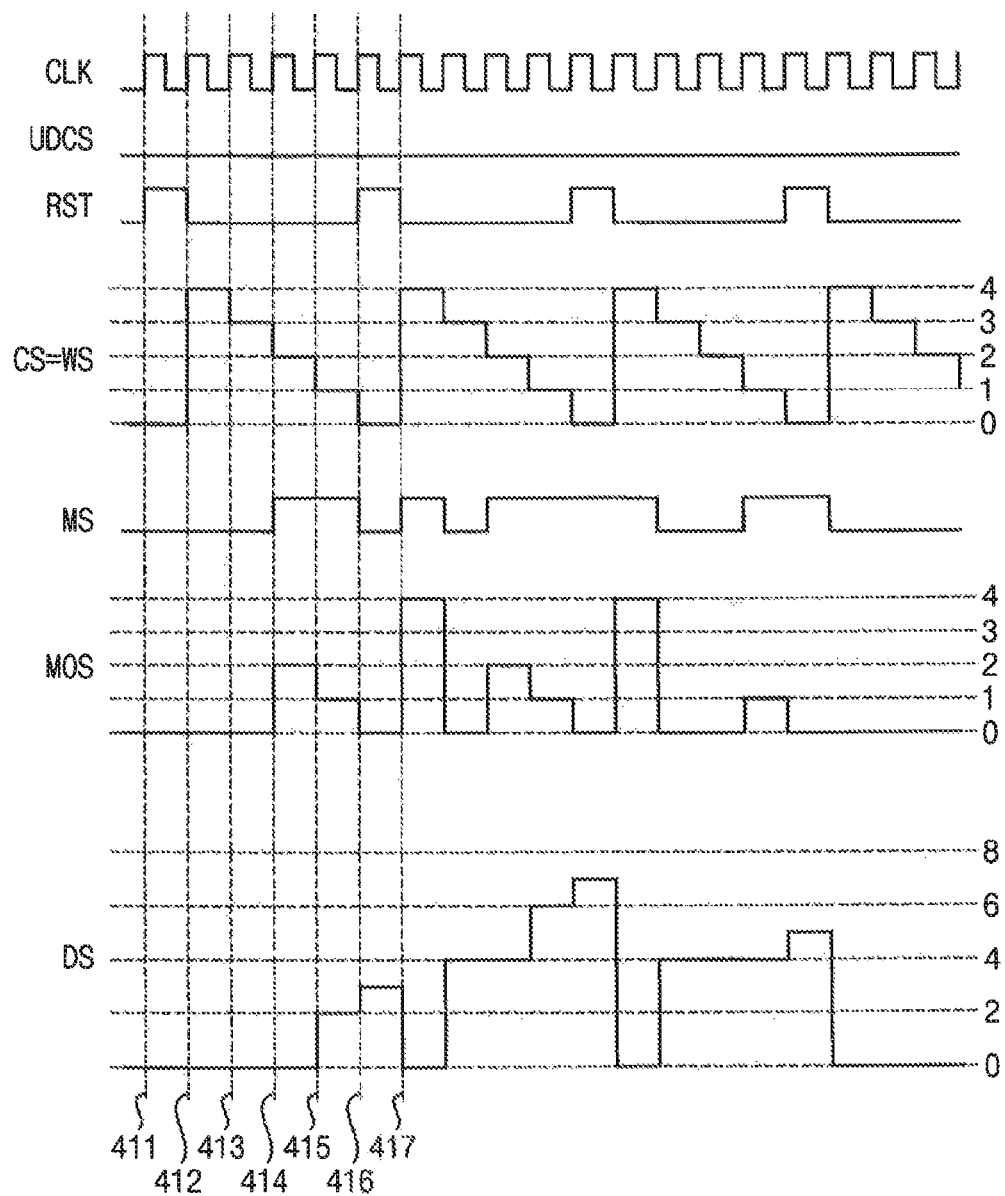

FIG. 10 is a timing diagram illustrating an exemplary embodiment of the inventive concept in which the analog-to-digital converter 100 includes the weight signal generator 110 and the first integrator 120a, and the weight signal generator 110 generates the weight signal WS corresponding to the first-order MATCHED digital filter.

The selection control signal SCS, which is input to the multiplexer 114 of the weight signal generator 110, has value 1. A first time point 411 through a seventh time point 417 are in synchronization with rising edges of the clock signal CLK, respectively. A period of the weight signal WS may be from the second time point 412 to the seventh time point 417.

At the first time point 411, the reset signal RST is activated.

At the second time point 412, the counter 111 initializes the count signal CS to 4 because the reset signal RST has logical value 1 from the first time point 411 to the second time point 412.

At the third time point 413, the counter 111 counts the count signal CS down from 4 to 3 because the count control signal UDCS has logical value 0 from the second time point 412 to the third time point 413.

At the fourth time point 414, the analog-to-digital converter 100 operates as follows. The counter 111 counts the count signal CS down from 3 to 2 because the count control signal UDCS has logical value 0 from the third time point 413 to the fourth time point 414. The multiplexer 114 outputs the count signal CS as the weight signal WS. The multiplexer 121a outputs the weight signal WS as the multiplexer output signal MOS because the level of the modulated signal MS is changed to 1.

At the fifth time point 415, the analog-to-digital converter 100 operates as follows. The counter 111 counts the count signal CS down from 2 to 1 because the count control signal UDCS has logical value 0 from the fourth time point 414 to the fifth time point 415. The multiplexer 114 outputs the count signal CS as the weight signal WS. The multiplexer 121a outputs the weight signal WS as the multiplexer output signal MOS because the level of the modulated signal MS maintains 1. The integration unit 122a outputs 2, which is calculated by adding the level of the initialized digital signal DS (0) and the level of the multiplexer output signal MOS from the fourth time point 414 to the fifth time point 415 (2), as the digital signal DS.

At the sixth time point 416, the analog-to-digital converter 100 operates as follows. The counter 111 counts the count signal CS down from 1 to 0 because the count control signal UDCS has logical value 0 from the fifth time point 415 to the sixth time point 416. The multiplexer 114 outputs the count signal CS as the weight signal WS. The multiplexer 121a outputs logical value 0 as the multiplexer output signal MOS because the level of the modulated signal MS is changed to 0. The integration unit 122a outputs 3, which is calculated by adding the level of the digital signal DS from the fifth time point 415 to the sixth time point 416 (2) and the level of the multiplexer output signal MOS from the fifth time point 415 to the sixth time point 416 (1), as the digital signal DS.

At the seventh time point 417, the analog-to-digital converter 100 operates as follows. The counter 111 initializes the count signal CS to 4 because the reset signal RST has logical value 1 from the sixth time point 416 to the seventh time point 417. A value of 3, which is the level of the digital signal DS from the sixth time point 416 to the seventh time point 417, corresponds to the analog signal AS input to the analog-to-digital converter 100 at a certain time.

Figure 11:
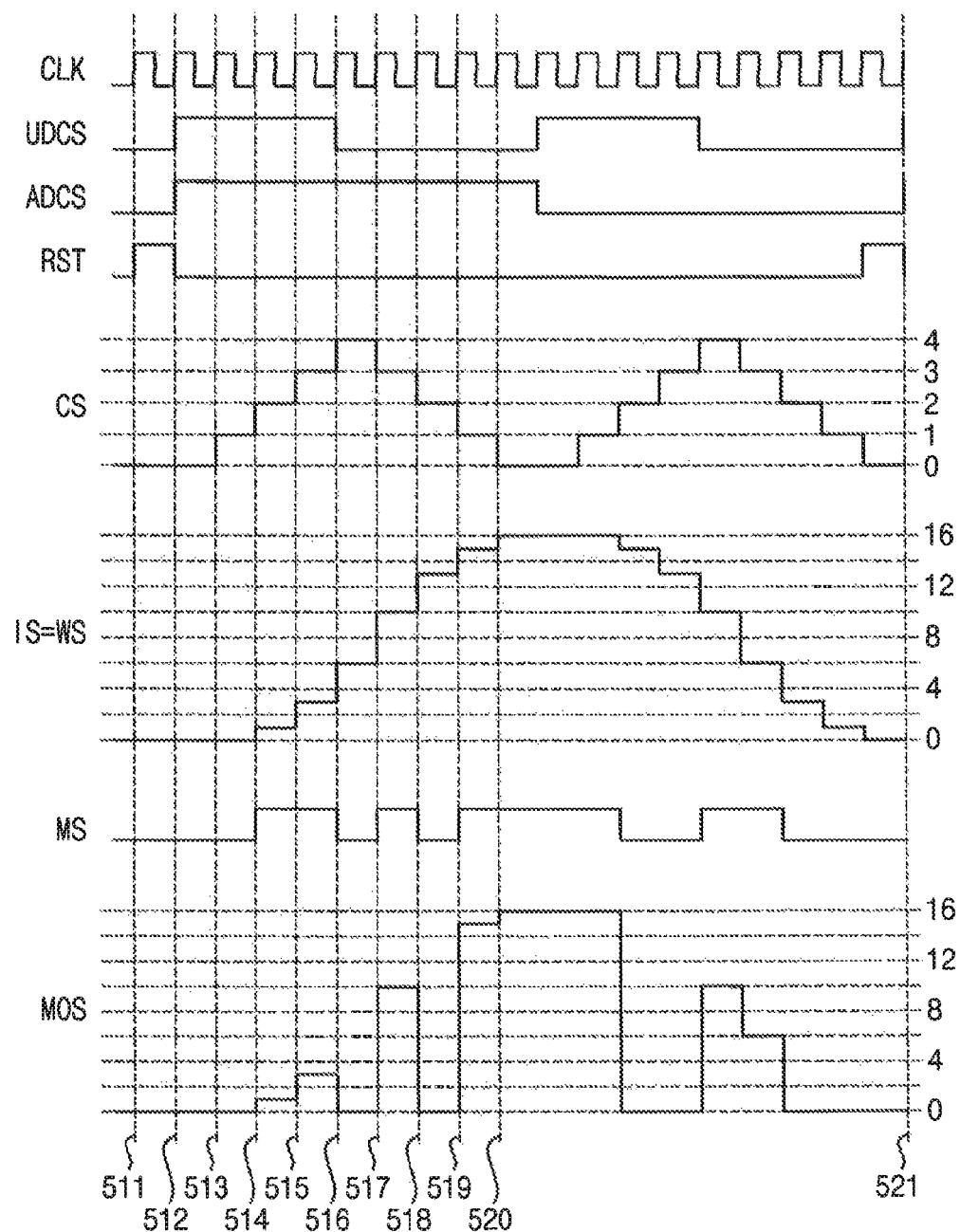

FIG. 11 is a timing diagram illustrating an exemplary embodiment of the inventive concept in which the analog-to-digital converter 100 includes the weight signal generator 110 and the first integrator 120a, and the weight signal generator 110 generates the weight signal WS corresponding to the third-order SINC digital filter.

The selection control signal SCS, which is input to the multiplexer 114 of the weight signal generator 110, has value 2. Operations of the integration unit 122a at time points 511 through 521 may be understood based on corresponding discussions made above with reference to FIGS. 8 through 10.

The first time point 511 through the eleventh time point 521 are in synchronization with rising edges of the clock signal CLK, respectively. A period of the weight signal WS may be from the second time point 512 to the eleventh time point 521.

At the first time point 511, the reset signal RST is activated.

At the second time point 512, the counter 111 initializes the count signal CS to 0 and the integration unit 113 initializes the integrated signal IS to 0 because the reset signal RST has logical value 1 from the first time point 511 to the second time point 512.

At the third time point 513, the counter 111 counts the count signal CS up from 0 to 1 because the count control signal UDCS has logical value 1 from the second time point 512 to the third time point 513.

At the fourth time point 514, the analog-to-digital converter 100 operates as follows. The counter 111 counts the count signal CS up from 1 to 2 because the count control signal UDCS has logical value 1 from the third time point 513 to the fourth time point 514. The integration unit 113 outputs 1, which is calculated by adding the level of the initialized integrated signal IS (0) and the level of the count signal CS from the third time point 513 to the fourth time point 514 (1), as the integrated signal IS, because the calculation control signal ADCS has logical value 1 from the third time point 513 to the fourth time point 514. The multiplexer 114 outputs the integrated signal IS as the weight signal WS. The multiplexer 121a outputs the weight signal WS as the multiplexer output signal MOS because the level of the modulated signal MS is changed to 1.

At the fifth time point 515, the analog-to-digital converter 100 operates as follows. The counter 111 counts the count signal CS up from 2 to 3 because the count control signal UDCS has logical value 1 from the fourth time point 514 to the fifth time point 515. The integration unit 113 outputs 3, which is calculated by adding the level of the integrated signal IS from the fourth time point 514 to the fifth time point 515 (1) and the level of the count signal CS from the fourth time point 514 to the fifth time point 515 (2), as the integrated signal IS, because the calculation control signal ADCS has logical value 1 from the fourth time point 514 to the fifth time point 515. The multiplexer 114 outputs the integrated signal IS as the weight signal WS. The multiplexer 121a outputs the weight signal WS as the multiplexer output signal MOS because the level of the modulated signal MS maintains 1.

At the sixth time point 516, the analog-to-digital converter 100 operates as follows. The counter 111 counts the count signal CS up from 3 to 4 because the count control signal UDCS has logical value 1 from the fifth time point 515 to the sixth time point 516. The integration unit 113 outputs 6, which is calculated by adding the level of the integrated signal IS from the fifth time point 515 to the sixth time point 516 (3) and the level of the count signal CS from the fifth time point 515 to the sixth time point 516 (3), as the integrated signal IS, because the calculation control signal ADCS has logical value 1 from the fifth time point 515 to the sixth time point 516. The multiplexer 114 outputs the integrated signal IS as the weight signal WS. The multiplexer 121a outputs logical value 0 as the multiplexer output signal MOS because the level of the modulated signal MS is changed to 0.

At the seventh time point 517, the analog-to-digital converter 100 operates as follows. The counter 111 counts the count signal CS down from 4 to 3 because the count control signal UDCS has logical value 0 from the sixth time point 516 to the seventh time point 517. The integration unit 113 outputs 10, which is calculated by adding the level of the integrated signal IS from the sixth time point 516 to the seventh time point 517 (6) and the level of the count signal. CS from the sixth time point 516 to the seventh time point 517 (4), as the integrated signal IS, because the calculation control signal ADCS has logical value 1 from the sixth time point 516 to the seventh time point 517. The multiplexer 114 outputs the integrated signal IS as the weight signal WS. The multiplexer 121a outputs the weight signal WS as the multiplexer output signal. MOS because the level of the modulated signal MS is changed to 1.

At the eighth time point 518, the analog-to-digital converter 100 operates as follows. The counter 111 counts the count signal CS down from 3 to 2 because the count control signal UDCS has logical value 0 from the seventh time point 517 to the eighth time point 518. The integration unit 113 outputs 13, which is calculated by adding the level of the integrated signal IS from the seventh time point 517 to the eighth time point 518 (10) and the level of the count signal CS from the seventh time point 517 to the eighth time point 518 (3), as the integrated signal IS, because the calculation control signal ADCS has logical value 1 from the seventh time point 517 to the eighth time point 518. The multiplexer 114 outputs the integrated signal IS as the weight signal WS. The multiplexer 121a outputs logical value 0 as the multiplexer output signal MOS because the level of the modulated signal MS is changed to 0.

At the ninth time point 519, the analog-to-digital converter 100 operates as follows. The counter 111 counts the count signal CS down from 2 to 1 because the count control signal UDCS has logical value 0 from the eighth time point 518 to the ninth time point 519. The integration unit 113 outputs 15, which is calculated by adding the level of the integrated signal IS from the eighth time point 518 to the ninth time point 519 (13) and the level of the count signal CS from the eighth time point 518 to the ninth time point 519 (2), as the integrated signal IS, because the calculation control signal ADCS has logical value 1 from the eighth time point 518 to the ninth time point 519. The multiplexer 114 outputs the integrated signal IS as the weight signal WS. The multiplexer 121a outputs the weight signal WS as the multiplexer output signal MOS because the level of the modulated signal MS is changed to 1.

At the tenth time point 520, the analog-to-digital converter 100 operates as follows. The counter 111 counts the count signal CS dove from 1 to 0 because the count control signal UDCS has logical value 0 from the ninth time point 519 to the tenth time point 520. The integration unit 113 outputs 16, which is calculated by adding the level of the integrated signal IS from the ninth time point 519 to the tenth time point 520 (15) and the level of the count signal CS from the ninth time point 519 to the tenth time point 520 (1), as the integrated signal IS, because the calculation control signal ADCS has logical value 1 from the ninth time point 519 to the tenth time point 520. The multiplexer 114 outputs the integrated signal IS as the weight signal WS. The multiplexer 121a outputs the weight signal WS as the multiplexer output signal MOS because the level of the modulated signal MS maintains 1.

Figure 12:
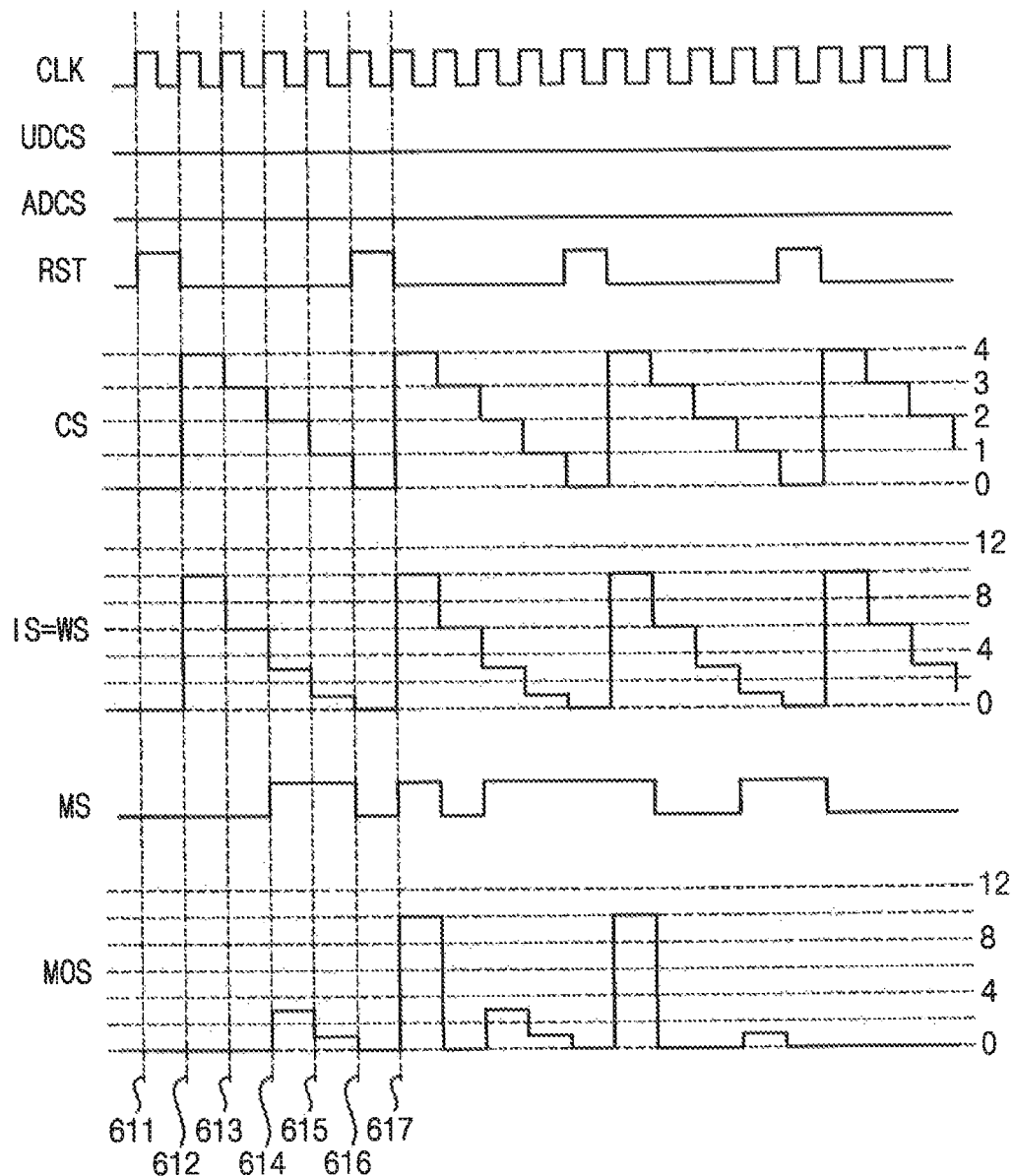

FIG. 12 is a timing diagram illustrating an exemplary embodiment of the inventive concept in which the analog-to-digital converter 100 includes the weight signal generator 110 and the first integrator 120a, and the weight signal generator 110 generates the weight signal WS corresponding to the second-order MATCHED digital filter.

The selection control signal SCS, which is input to the multiplexer 114 of the weight signal generator 110, has value 2. Operations of the integration unit 122a at time points 611 through 617 may be understood based on corresponding discussions made above with reference to FIGS. 8 through 11.

The first time point 611 through the seventh time point 617 are in synchronization with rising edges of the clock signal CLK, respectively. A period of the weight signal WS may be from the second time point 612 to the seventh time point 617.

At the first time point 611, the reset signal RST is activated.

At the second time point 612, the counter 111 initializes the count signal CS to 4 and the integration unit 113 initializes the integrated signal IS to 10 because the reset signal RST has logical value 1 from the first time point 611 to the second time point 612.

At the third time point 613, the analog-to-digital converter 100 operates as follows. The counter 111 counts the count signal CS down from 4 to 3 because the count control signal UDCS has logical value 0 from the second time point 612 to the third time point 613. The integration unit 113 outputs 6, which is calculated by subtracting the level of the count signal CS from the second time point 612 to the third time point 613 (4) from the level of initialized integrated signal IS (10), as the integrated signal IS, because the calculation control signal ADCS has logical value 0 from the second time point 612 to the third time point 613. The multiplexer 114 outputs the integrated signal IS as the weight signal WS. The multiplexer 121a outputs logical value 0 as the multiplexer output signal MOS because the level of the modulated signal MS is 0.

At the fourth time point 614, the analog-to-digital converter 100 operates as follows. The counter 111 counts the count signal CS down from 3 to 2 because the count control signal UDCS has logical value 0 from the third time point 613 to the fourth time point 614. The integration unit 113 outputs 3, which is calculated by subtracting the level of the count signal CS from the third time point 613 to the fourth time point 614 (3) from the level of the integrated signal IS from the third time point 613 to the fourth time point 614 (6), as the integrated signal IS, because the calculation control signal ADCS has logical value 0 from the third time point 613 to the fourth time point 614. The multiplexer 114 outputs the integrated signal IS as the weight signal WS. The multiplexer 121a outputs the weight signal WS as the multiplexer output signal MOS because the level of the modulated signal MS is changed to 1.

At the fifth time point 615, the analog-to-digital converter 100 operates as follows. The counter 111 counts the count signal CS down from 2 to 1 because the count control signal UDCS has logical value 0 from the fourth time point 614 to the fifth time point 615. The integration unit 113 outputs 1, which is calculated by subtracting the level of the count signal CS from the fourth time point 614 to the fifth time point 615 (2) from the level of the integrated signal IS from the fourth time point 614 to the fifth time point 615 (3), as the integrated signal. IS, because the calculation control signal ADCS has logical value 0 from the fourth time point 614 to the fifth time point 615. The multiplexer 114 outputs the integrated signal IS as the weight signal WS. The multiplexer 121a outputs the weight signal WS as the multiplexer output signal MOS because the level of the modulated signal MS maintains 1.

At the sixth time point 616, the analog-to-digital converter 100 operates as follows. The counter 111 counts the count signal CS down from 1 to 0 because the count control signal UDCS has logical value 0 from the fifth time point 615 to the sixth time point 616. The integration unit 113 outputs 0, which is calculated by, subtracting the level of the count signal CS from the fifth time point 615 to the sixth time point 616 (1) from the level of the integrated signal IS from the fifth time point 615 to the sixth time point 616 (1), as the integrated signal IS, because the calculation control signal ADCS has logical value 0 from the fifth time point 615 to the sixth time point 616. The multiplexer 114 outputs the integrated signal IS as the weight signal WS. The multiplexer 121a outputs logical value 0 as the multiplexer output signal MOS because the level of the modulated signal MS is changed to 0.

At the seventh time point 617, the analog-to-digital converter 100 operates as follows. The counter 111 initializes the count signal CS to 4 and the integration unit 113 initializes the integrated signal IS to 10 because the reset signal RST has logical value 1 from the sixth time point 616 to the seventh time point 617.

Figure 13:
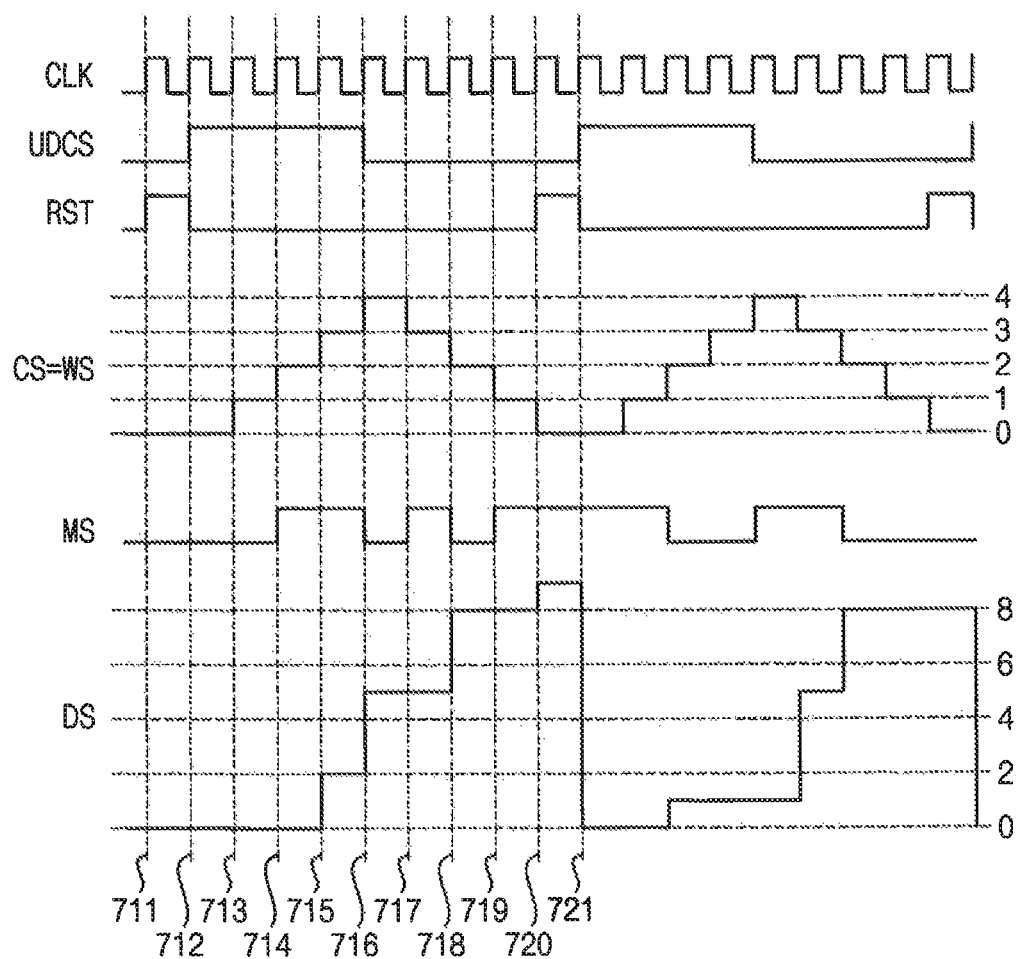
FIGS. 13, 14 and 15 are timing diagrams illustrating an operation of the analog-to-digital converter which includes the first integrator of FIG. 6, according to an exemplary embodiment of the inventive concept.
Figure 14:
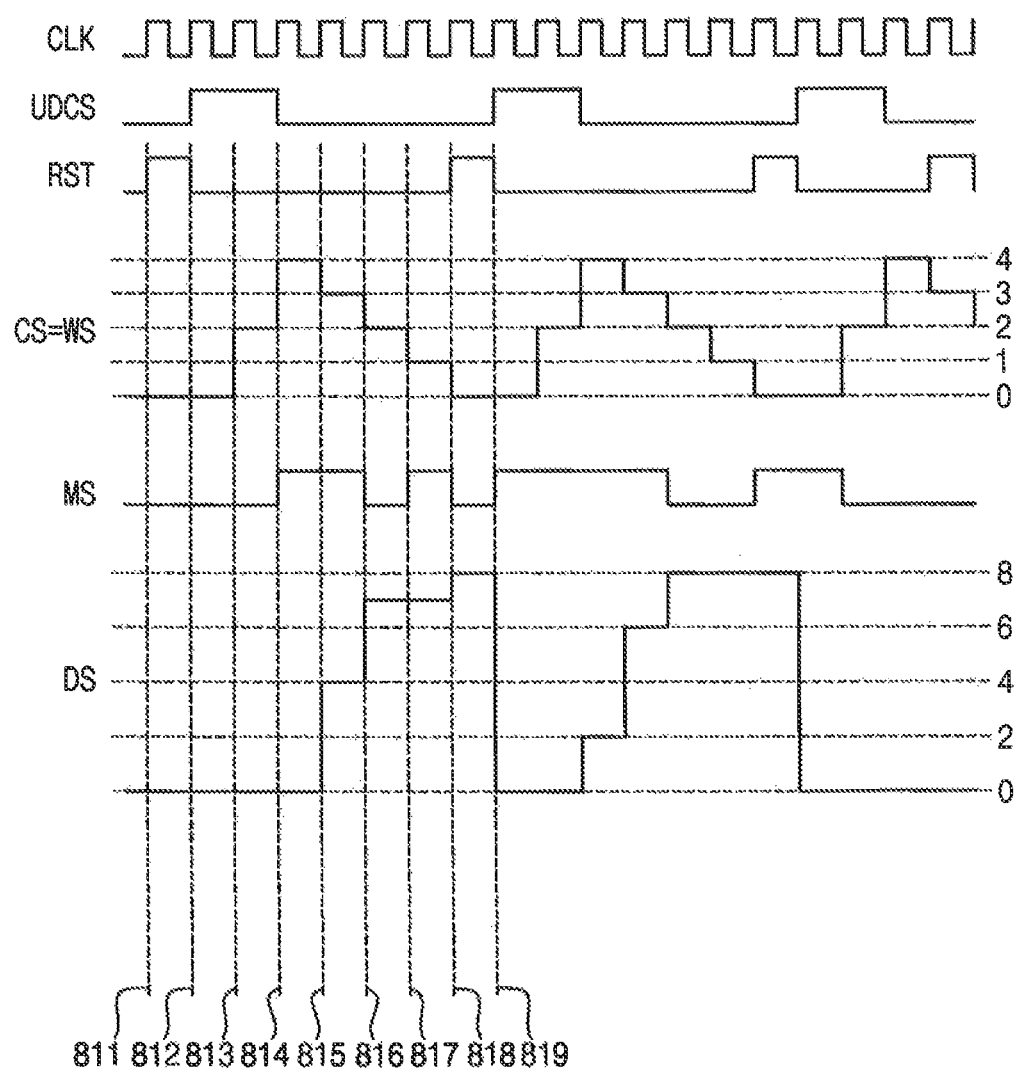
Figure 15:
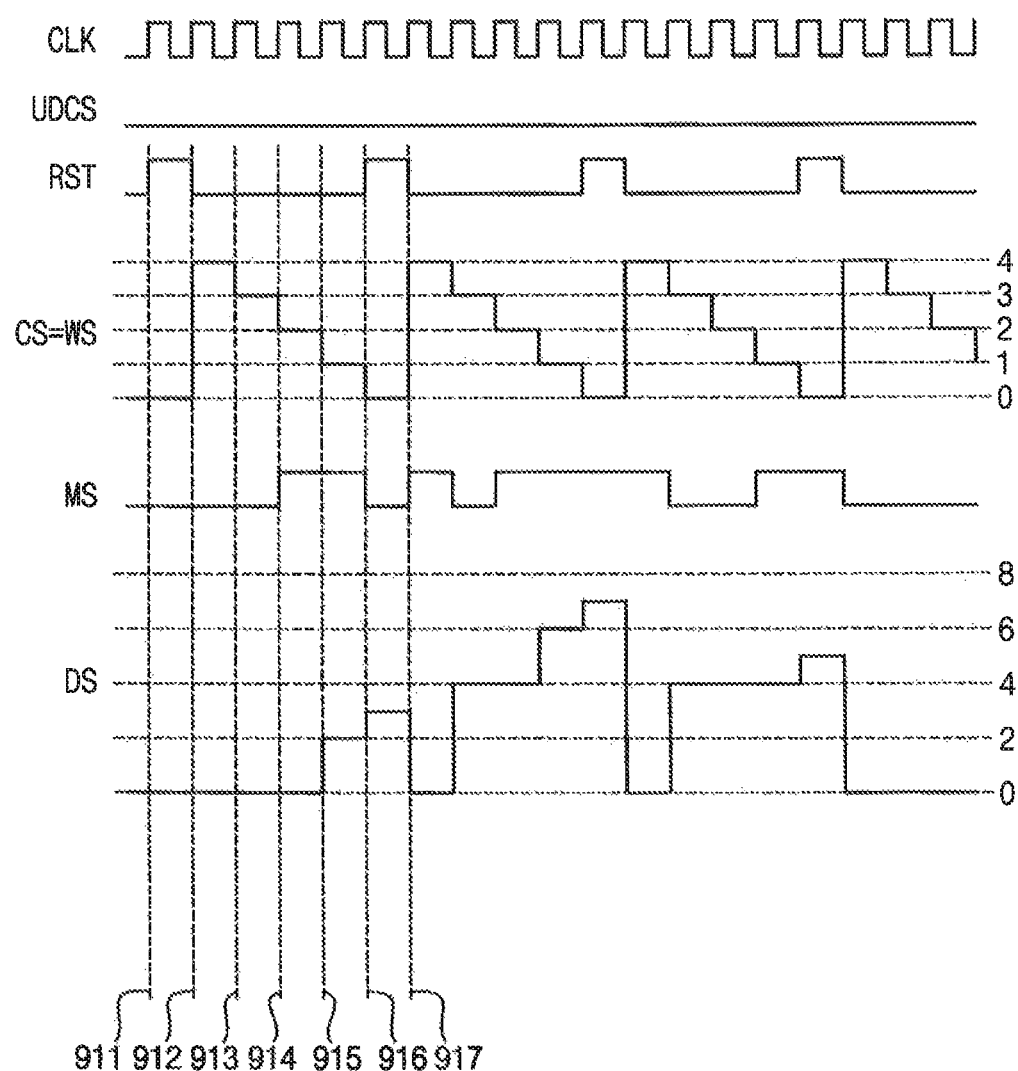

FIGS. 13 through 15 are timing diagrams illustrating an operation of the analog-to-digital converter 100 which includes the first integrator 120b of FIG. 6, according to an exemplary embodiment of the inventive concept.

FIG. 13 is a timing diagram illustrating an exemplary embodiment of the inventive concept in which the analog-to-digital converter 100 includes the weight signal generator 110 and the first integrator 120h, and the weight signal generator 110 generates the weight signal WS corresponding to the second-order SINC digital filter.

The selection control signal SCS, which is input to the multiplexer 114 of the weight signal generator 110, has value 1. A first time point 711 through an eleventh time point 721 are in synchronization with rising edges of the clock signal CLK, respectively. A period of the weight signal WS may be from the second time point 712 to the eleventh time point 721.

At the first time point 711, the reset signal RST is activated.

At the second time point 712, the counter 111 initializes the count signal CS to 0 because the reset signal RST has logical value 1 from the first time point 711 to the second time point 712.

At the third time point 713, the counter 111 counts the count signal CS up from 0 to 1 because the count control signal UDCS has logical value 1 from the second time point 712 to the third time point 713.

At the fourth time point 714, the analog-to-digital converter 100 operates as follows. The counter 111 counts the count signal CS up from 1 to 2 because the count control signal UDCS has logical value 1 from the third time point 713 to the fourth time point 714. The multiplexer 114 outputs the count signal CS as the weight signal WS.

At the fifth time point 715, the analog-to-digital converter 100 operates as follows. The counter 111 counts the count signal CS up from 2 to 3 because the count control signal UDCS has logical value 1 from the fourth time point 714 to the fifth time point 715. The multiplexer 114 outputs the count signal CS as the weight signal WS. The integration unit 122b outputs 2, which is calculated by adding the level of the initialized digital signal DS (0) and the level of the weight signal WS from the fourth time point 714 to the fifth time point 715 (2), as the digital signal DS.

At the sixth time point 716, the analog-to-digital converter 100 operates as follows. The counter 111 counts the count signal CS up from 3 to 4 because the count control signal UDCS has logical value 1 from the fifth time point 715 to the sixth time point 716. The multiplexer 114 outputs the count signal CS as the weight signal WS. The integration unit 122b outputs 5, which is calculated by adding the level of the digital signal DS from the fifth time point 715 to the sixth time point 716 (2) and the level of the weight signal WS from the fifth time point 715 to the sixth time point 716 (3), as the digital signal DS.

At the seventh time point 717, the analog-to-digital converter 100 operates as follows. The counter 111 counts the count signal CS down from 4 to 3 because the count control signal UDCS has logical value 0 from the sixth time point 716 to the seventh time point 717. The multiplexer 114 outputs the count signal CS as the weight signal WS. The integration unit 122b maintains 5, which is the level of the digital signal DS from the sixth time point 716 to the seventh time point 717.

At the eighth time point 718, the analog-to-digital converter 100 operates as follows. The counter 111 counts the count signal CS down from 3 to 2 because the count control signal UDCS has logical value 0 from the seventh time point 717 to the eighth time point 718. The is multiplexer 114 outputs the count signal CS as the weight signal WS. The integration unit 122b outputs 8, which is calculated by adding the level of the digital signal DS from the seventh time point 717 to the eighth time point 718 (5) and the level of the weight signal WS from the seventh time point 717 to the eighth time point 718 (3), as the digital signal DS.

At the ninth time point 719, the analog-to-digital converter 100 operates as follows. The counter 111 counts the count signal CS down from 2 to 1 because the count control signal UDCS has logical value 0 from the eighth time point 718 to the ninth time point 719. The multiplexer 114 outputs the count signal CS as the weight signal WS. The integration unit 122b maintains 8, which is the level of the digital signal DS from the eighth time point 718 to the ninth time point 719.

At the tenth time point 720, the analog-to-digital converter 100 operates as follows. The counter 111 counts the count signal CS down from 1 to 0 because the count control signal UDCS has logical value 0 from the ninth time point 719 to the tenth time point 720. The multiplexer 114 outputs the count signal CS as the weight signal WS. The integration unit 122b outputs 9, which is calculated by adding the level of the digital signal DS from the ninth time point 719 to the tenth time point 720 (8) and the level of the weight signal WS from the ninth time point 719 to the tenth time point 720 (1), as the digital signal DS.

At the eleventh time point 721, the analog-to-digital converter 100 operates as follows. The counter 111 initializes the count signal CS to 0 because the reset signal RST has logical value 1 from the tenth time point 720 to the eleventh time point 721. A value of 9, which is the level of the digital signal DS from the tenth time point 720 to the eleventh time point 721, corresponds to the analog signal AS input to the analog-to-digital converter 100 at a certain time.

FIG. 14 is a timing diagram illustrating an exemplary embodiment of the inventive concept in which the analog-to-digital converter 100 includes the weight signal generator 110 and the first integrator 120b, and the weight signal generator 110 generates the weight signal WS corresponding to the CUSTOM digital filter. FIG. 14 may be understood based on corresponding discussions made above with reference to FIGS. 9 and 13.

For example, a first time point 811 through a ninth time point 819 are in synchronization with rising edges of the clock signal CLK, respectively. A period of the weight signal WS may be from the second time point 812 to the ninth time point 819. Like that shown in FIG. 9, the count signal CS counts up by two in the third and fourth time points 813 and 814 and then down by one in the remaining time points until the count signal CS is 0 by the eighth time point 818. The modulated signal MS may have the same levels as that shown in FIGS. 9 and 13. The digital signal DS may have the same levels as that shown in FIG. 9. However, the digital signal DS may be arrived at by the techniques described with reference to FIG. 13.

FIG. 15 is a timing diagram illustrating an exemplary embodiment of the inventive concept in which the analog-to-digital converter 100 includes the weight signal generator 110 and the first integrator 120b, and the weight signal generator 110 generates the weight signal WS corresponding to the first-order MATCHED digital filter. FIG. 15 may be understood based on corresponding discussions made above with reference to FIGS. 10 and 12.

For example, a first time point 911 through a seventh time point 917 are in synchronization with rising edges of the clock signal CLK, respectively. A period of the weight signal WS may be from the second time point 912 to the seventh time point 917. Like that shown in FIG. 10, the count signal CS is initialized to 4 at the second time point 912 and then counted down by one in the remaining time points until the count signal CS is 0 by the sixth time point 916. The modulated signal MS may have the same levels as that shown in FIGS. 10 and 12. The digital signal DS may have the same levels as that shown in FIG. 10.

Figure 16:
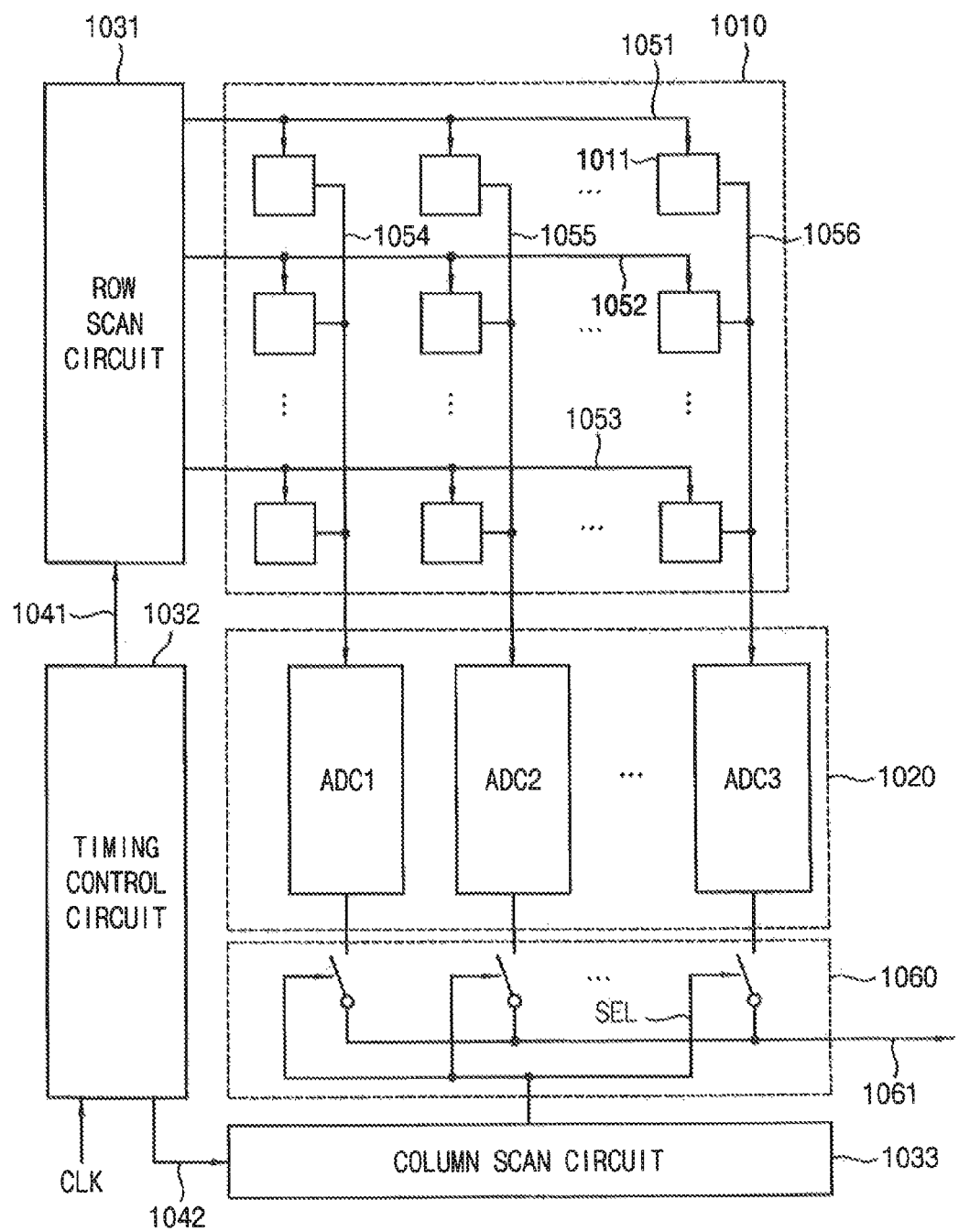
FIG. 16 is a block diagram illustrating an image sensor including the analog-to-digital converter of FIG. 1, according to an exemplary embodiment of the inventive concept.

FIG. 16 is a block diagram illustrating an image sensor including the analog-digital converter 100 of FIG. 1, according to an exemplary embodiment of the inventive concept.

Referring to FIG. 16, an image sensor 1000 includes a pixel array 1010, an image detecting circuit 1020, a switch circuit 1060, a timing control circuit 1032, a row scan circuit 1031, and a column scan circuit 1033. The pixel array 1010 includes a plurality of pixels 1011. The image detecting circuit 1020 includes a plurality of analog-to-digital converters ADC1, and ADC2 through ADC3. The switch circuit 1060 includes a plurality of switches and a common output line 1061.

The timing control circuit 1032 generates a row scan circuit control signal 1041 and a column scan circuit control signal 1042 based on the clock signal CLK. The row scan circuit 1031 activates one of a first row control signal 1051, and a second row control signal 1052 through an (N)-th row control signal 1053 in response to the row scan circuit control signal 1041. The column scan circuit 1033 generates a column selection signal SEL in response to the column scan circuit control signal 1047.

The pixel array 1010 outputs pixel signals corresponding to incident light. The pixel signals generated by the pixels, which are selected based on the row control signals 1051, and 1052 through 1053, are transferred to the analog-to-digital converters ADC1, and ADC2 through ADC3 as column signals 1054, and 1055 through 1056.

The analog-to-digital converters ADC1 and ADC2 through ADC3 generate digital signals corresponding to the pixel signals. The analog-to-digital converters ADC1, and ADC2 through ADC3 may be one of the analog-to-digital converters described above with reference to FIGS. 1 through 15.

The switch circuit 1060 selects one of the digital signals based on the column selection signal SEL. The switch circuit 1060 outputs the selected digital signal through the common output line 1061. Each of the digital signals generated by the analog-to-digital converters ADC1, and ADC2 through ADC3 is provided to a terminal of each of the switches. Another terminal of each of the switches is electrically connected to the common output line 1061.

Figure 17:
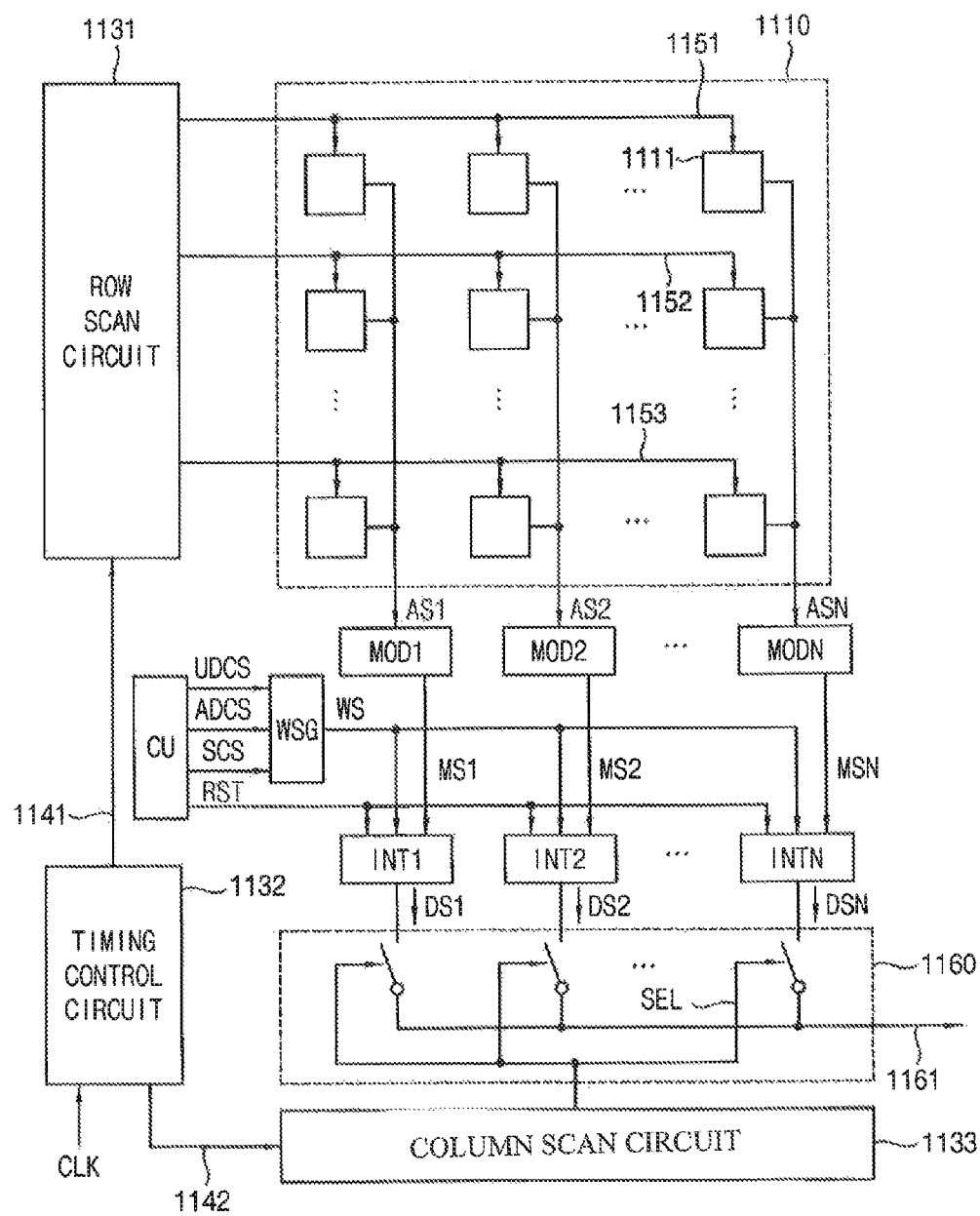
FIG. 17 is a block diagram illustrating an image sensor according to an exemplary embodiment of the inventive concept.

FIG. 17 is a block diagram illustrating an image sensor according to an exemplary embodiment of the inventive concept.

Referring to FIG. 17, an image sensor 1100 includes a pixel array 1110, a controller CU, a weight signal generator WSG, first through (N)-th modulators MOD1, MOD2 through MODN, first through (N)-th integrators INT1, INT2 through INTN, a switch circuit 1160, a timing control circuit 1132, a row scan circuit 1131, and a column scan circuit 1133 (N is a natural number).

The pixel array 1110 includes a plurality of pixels 1111 outputting first through (N)-th pixel signals AS1, AS2 through ASN corresponding to intensity of incident light.

The controller CU generates a weight control signal UDCS, ADCS, SCS. The weight control signal UDCS, ADCS, SCS corresponds to a type and an order of digital filtering. The weight signal generator WSG generates a weight signal WS based on the weight control signal UDCS, ADCS, SCS. In an exemplary embodiment of the inventive concept, the weight control signal UDCS, ADCS, SCS may include a count control signal UDCS, a calculation control signal ADCS and a selection control signal SCS. In an exemplary embodiment of the inventive concept, the count control signal UDCS and the calculation control signal ADCS may be periodic signals, respectively.

The weight signal generator WSG, the first modulator MOD1, and the first integrator INT1 forms a first analog-digital converter having the same structure as the analog-digital converter 100 of FIG. 1. The first modulator MOD1 generates the first modulated signal MS1 based on the first pixel signal AS1. The first integrator INT1 generates the first digital signal DS1 corresponding to the first pixel signal AS1 by integrating the weight signal WS in response to the first modulated signal MS1.

The weight signal generator WSG, the second modulator MOD2, and the second integrator INT2 form a second analog-digital converter having the same structure as the analog-digital converter 100 of FIG. 1. The second modulator MOD2 generates the second modulated signal MS2 based on the second pixel signal AS2. The second integrator INT2 generates the second digital signal DS2 corresponding to the second pixel signal AS2 by integrating the weight signal WS in response to the second modulated signal MS2.

The weight signal generator WSG, the (N)-th modulator MODN, and the (N)-th integrator INTN form a (N)-th analog-digital converter having the same structure as the analog-digital converter 100 of FIG. 1. The (N)-th modulator MODN generates the (N)-th modulated signal MSN based on the (N)-th pixel signal ASN. The (N)-th integrator INTN generates the (N)-th digital signal DSN corresponding to the (N)-th pixel signal ASN by integrating the weight signal WS in response to the (N)-th modulated signal MSN.

Operation and structure of the first through (N)-th analog-digital converters may be understood based on the references to FIGS. 1 through 15.

The switch circuit 1160 selects one of the first through (N)-th digital signals DS1, DS2 through DSN based on a column selection signal 1142. The switch circuit 1160 outputs the selected digital signal.

Remaining of the FIG. 17 may be understood based on the reference to FIG. 16.

Figure 18:
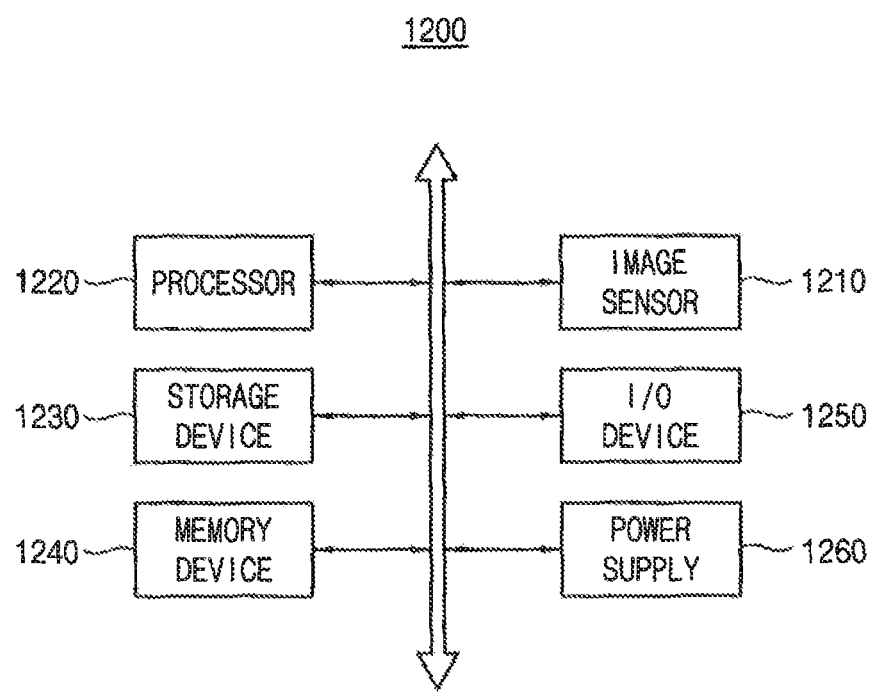
FIG. 18 is a computing system including the image sensor of FIG. 16 or the image sensor of FIG. 17 according to an exemplary embodiment of the inventive concept.

FIG. 18 is a computing system including the image sensor of FIG. 16 or the image sensor of FIG. 17 according to an exemplary embodiment of the inventive concept.

Referring to FIG. 18, a computing system 1200 may include an image sensor 1210, a processor 1220 and a storage device 1230.

The image sensor 1210 may generate a digital signal corresponding to incident light. The storage device 1230 may store the digital signal. The processor 1220 may control operations of the image sensor 1210 and the storage device 1230.

The computing system 1200 may further include a memory device 1240, an input/output device 1250 and a power supply 1260. Although it is not illustrated in FIG. 18, the computing system 1200 may further include ports that communicate with a video card, a sound card, a memory card, a universal serial bus (USB) device, or other electronic devices.

The processor 1220 may perform various calculations or tasks. According to an exemplary embodiment of the present inventive concept, the processor 1220 may be a microprocessor or a central processing unit (CPU). The processor 1220 may communicate with the storage device 1230, the memory device 1240 and the input/output device 1250 via an address bus, a control bus, and/or a data bus. In an exemplary embodiment of the inventive concept, the processor 1220 may be coupled to an extended bus, such as a peripheral component interconnection (PCI) bus.

The storage device 1230 may include a non-volatile memory device such as a flash memory device, a solid state drive (SSD), a hard disk drive (HDD), a compact disk read-only memory (CD-ROM) drive, etc.

The memory device 1240 may store data required for an operation of the computing system 1200. The memory device 1240 may be a dynamic random access memory (DRAM), a static random access memory (SRAM), or a non-volatile memory, such as an erasable programmable read-only memory (EPROM), an electrically erasable programmable read-only memory (EEPROM), a flash memory, etc.

The input/output device 1250 may include a keyboard, a mouse, a printer, a display device, etc. The power supply 1260 may supply operational power.

The image sensor 1210 may be connected to the processor 1220 through one or more of the above buses or other communication links to communicate with the processor 1220.

The image sensor 1210 may be embodied as the image sensor 1000 of FIG. 16 or the image sensor 1100 of FIG. 17. A structure and operation of the image sensor 1210 may be understood based on corresponding discussions made above with reference to FIGS. 1 through 17.

The image sensor 1210 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), or wafer-level processed stack package (WSP).

According to an exemplary embodiment of the inventive concept, the image sensor 1210 may be integrated with the processor 1220 in one chip, or the image sensor 1210 and the processor 1220 may be implemented as separate chips.

The computing system 1200 may be any computing system using an image sensor. For example, the computing system 1200 may include a digital camera, a mobile phone, a smart phone, a portable multimedia player (PMP), a personal digital assistant (PDA), etc.

FIG. 19 is a computing system according to an exemplary embodiment of the inventive concept.

Referring to FIG. 19, a computing system 1300 may be implemented by a data processing device (e.g., a cellular phone, a PDA, a PMP, a smart phone, etc.) that uses or supports a mobile industry processor interface (MIPI) interface. The computing system 1300 may include an application processor 1310, an image sensor 1340, a display device 1350, etc.

A CSI host 1312 of the application processor 1310 may perform a serial communication with a CSI device 1341 of the image sensor 1340 via a camera serial interface (CSI). In an exemplary embodiment of the inventive concept, the CSI host 1312 may include a deserializer (DES), and the CSI device 1341 may include a serializer (SER). A DSI host 1311 of the application processor 1310 may perform a serial communication with a DSI device 1351 of the display device 1350 via a display serial interface (DSI). In an exemplary embodiment of the inventive concept, the DSI host 1311 may include a serializer (SER), and the DSI device 1351 may include a deserializer (DES).

The image sensor 1340 may be embodied as the image sensor 1000 of FIG. 16 or the image sensor 1100 of FIG. 17. A structure, and operation of the image sensor 1340 may be understood based on corresponding discussions made above with reference to FIGS. 1 through 17.

The computing system 1300 may further include a radio frequency (RF) chip 1360 for performing a communication with the application processor 1310. A physical layer (PRY) 1313 of the computing system 1300 and a physical layer (PRY) 1361 of the RE chip 1360 may perform data communications based on a MIPI DigRF. The application processor 1310 may further include a DigRF MASTER 1314 that controls the data communications according to the MIPI DigRF of the PRY 1361, and the RF chip 1360 may further include a DigRF SLAVE 1362 controlled by the DigRF MASTER 1314.

The computing system 1300 may further include a global positioning system (GPS) 1320, a storage 1370, a microphone MIC 1380, a DRAM device 1385, and a speaker 1390. In addition, the computing system 1300 may perform communications using an ultra wideband (UWB) link 1410, a wireless local area network (WLAN) 1420, a worldwide interoperability for microwave access (WIMAX) link 1430, etc. However, the structure and the interface of the computing system 1300 are not limited thereto. The computing system 1300 of FIG. 19 may be configured to include some or all of the components shown in FIG. 18.

In accordance with an exemplary embodiment of the inventive concept, the above described analog-to-digital converter and an image sensor including the same may perform a digital filtering function with various types and orders based on a configurable weight signal. A digital filter included in the analog-to-digital converter may be implemented in a fixed die size irrespective of the orders of the digital filtering.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. An analog-to-digital converter, comprising:
 a modulator configured to generate a modulated signal based on an analog signal;
 a controller configured to generate a weight control signal; and
 a digital filter including a weight signal generator and a first integrator, the weight signal generator configured to generate a weight signal based on the weight control signal, the first integrator configured to generate a digital signal corresponding to the analog signal by integrating the weight signal in response to the modulated signal,
 wherein the weight control signal corresponds to a type and an order of the digital filter.

2. The analog-to-digital converter of claim 1, wherein the weight control signal includes a count control signal, a calculation control signal and a selection control signal.

3. The analog-to-digital converter of claim 2, wherein the count control signal and the calculation control signal are periodic signals, respectively.

4. The analog-to-digital converter of claim 3, wherein the weight signal generator initializes the weight signal at each of at least two periods of the count control signal and the calculation control signal in response to a reset signal generated by the controller,
 wherein the first integrator initializes the digital signal at each of at least two periods of the count control signal and the calculation control signal in response to the reset signal.

5. The analog-to-digital converter of claim 2, wherein the weight signal generator includes a counter, an integration unit, a first register, and a multiplexer,
 wherein the counter generates a count signal by counting a number of edges of a clock signal in response to the count control signal,
 wherein the integration unit generates an integrated signal by integrating the count signal in response to the calculation control signal,
 wherein the multiplexer outputs one of the count signal, the integrated signal, and an output signal of the first register as the weight signal in response to the selection control signal.

6. The analog-to-digital converter of claim 5, wherein the counter executes an up-counting for the count signal when the count control signal has logical value 1,
 wherein the counter executes a down-counting for the count signal when the count control signal has logical value 0,
 wherein the counter initializes the count signal in response to a reset signal generated by the controller.

7. The analog-to-digital converter of claim 5, wherein the integration unit includes a calculation unit and a second register,
 wherein the calculation unit generates a calculated signal by adding the integrated signal and the count signal or generates the calculated signal by subtracting the count signal from the integrated signal in response to the calculation control signal,
 wherein the second register stores the calculated signal as the integrated signal in synchronization with the clock signal,
 wherein the second register initializes the integrated signal in response to a reset signal generated by the controller.

8. The analog-to-digital converter of claim 7, wherein the calculation unit generates the calculated signal by adding the integrated signal and the count signal when the calculation control signal has logical value 1, wherein the calculation unit generates the calculated signal by subtracting the count signal from the integrated signal when the calculation control signal has logical value 0.

9. The analog-to-digital converter of claim 1, wherein the first integrator includes a multiplexer and an integration unit,
wherein the multiplexer outputs one of the weight signal and logical value 0 as a multiplexer output signal in response to the modulated signal,
wherein the integration unit generates the digital signal by integrating the multiplexer output signal in response to a clock signal.

10. The analog-to-digital converter of claim 9, wherein the integration unit includes an adder and a register,
wherein the adder generates an added signal by adding the multiplexer output signal and the digital signal,
wherein the register stores the added signal as the digital signal in synchronization with the clock signal,
wherein the register initializes the digital signal in response to a reset signal generated by the controller.

11. The analog-to-digital converter of claim 1, wherein the first integrator includes a AND gate and an integration unit,
wherein the AND gate generates a register control signal by performing a logical AND operation on the modulated signal and a clock signal,
wherein the integration unit generates the digital signal by integrating the weight signal in response to the register control signal.

12. The analog-to-digital converter of claim 11, wherein the integration unit includes an adder and a register,
wherein the adder generates an added signal by adding the weight signal and the digital signal,
wherein the register stores the added signal as the digital signal in synchronization with the register control signal,
wherein the register initializes the digital signal in response to a reset signal generated by the controller.

13. The analog-to-digital converter of claim 1, wherein the type of the digital filter is a MATCHED type or a SINC type.

14. The analog-to-digital converter of claim 1, wherein the type of the digital filter is a CUSTOM type having a user-defined frequency response.

15. The analog-to-digital converter of claim 1, wherein the order of the digital filter is one, two or three.

16. An image sensor, comprising:
a pixel array including a plurality of pixels configured to output pixel signals corresponding to incident light;
a plurality of analog-to-digital converters configured to generate digital signals corresponding to the pixel signals; and
a switch circuit configured to select one of the digital signals based on a column selection signal, the switch circuit configured to output the selected digital signal, at least one of the plurality of the analog-to-digital converters including:
a modulator configured to generate a modulated signal based on the pixel signals;
a controller configured to generate a weight control signal; and
a digital filter including a weight signal generator and an integrator, the weight signal generator configured to generate a weight signal based on the weight control signal, the integrator configured to generate the digital signals corresponding to the pixel signals by integrating the weight signal in response to the modulated signal,
wherein the weight control signal corresponds to a type and an order of the digital filter.

17. An image sensor, comprising:
a pixel array including a plurality of pixels outputting first through (N)-th pixel signals corresponding to intensity of incident light (N is a natural number);
a controller configured to generate a weight control signal;
a weight signal generator configured to generate a weight signal based on the weight control signal;
first through (N)-th modulators;
first through (N)-th integrators; and
a switch circuit configured to select one of first through (N)-th digital signals based on a column selection signal, the switch circuit configured to output the selected digital signal,
wherein the weight control signal corresponds to a type and an order of digital filtering,
wherein the (K)-th modulator generates the (K)-th modulated signal based on the (K)-th pixel signal (K is a natural number less than or equal to N),
wherein the (K)-th integrator generates the (K)-th digital signal corresponding to the (K)-th pixel signal by integrating the weight signal in response to the (K)-th modulated signal.

18. The image sensor of claim 17, wherein the weight control signal includes a count control signal, a calculation control signal and a selection control signal.

19. The image sensor of claim 18, wherein the count control signal and the calculation control signal are periodic signals, respectively.

* * * * *